(12) United States Patent
Iida et al.

(10) Patent No.: US 9,214,370 B2
(45) Date of Patent: Dec. 15, 2015

(54) SUBSTRATE TRANSFER DEVICE, SUBSTRATE TRANSFER METHOD, AND STORAGE MEDIUM

(71) Applicant: TOKYO ELECTRON LIMITED, Tokyo (JP)

(72) Inventors: Naruaki Iida, Koshi (JP); Akihiro Teramoto, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 265 days.

(21) Appl. No.: 13/859,822

(22) Filed: Apr. 10, 2013

(65) Prior Publication Data
US 2013/0272824 A1    Oct. 17, 2013

(30) Foreign Application Priority Data
Apr. 12, 2012   (JP) ................... 2012-091111

(51) Int. Cl.
*H01L 21/677*   (2006.01)
*H01L 21/67*    (2006.01)

(52) U.S. Cl.
CPC ........ *H01L 21/677* (2013.01); *H01L 21/67265* (2013.01); *H01L 21/67772* (2013.01); *H01L 21/67775* (2013.01); *H01L 21/67778* (2013.01)

(58) Field of Classification Search
CPC .................. H01L 21/67772; H01L 21/67265; H01L 21/67775; H01L 21/67778
USPC ........ 414/217, 411, 416.03, 416.07, 935, 940
See application file for complete search history.

(56) References Cited

U.S. PATENT DOCUMENTS 6,517,304 B1 *   2/2003   Matsumoto .................. 414/217

FOREIGN PATENT DOCUMENTS

| JP | 10-125763 A   | 5/1998 |
| JP | 2008-108966 A | 5/2008 |
| JP | 2009-065212 A | 3/2009 |
| JP | 2010-514211 A | 4/2010 |
| WO | 2008/085233 A1 | 7/2008 |

* cited by examiner

*Primary Examiner* — Ernesto Suarez
*Assistant Examiner* — Ronald Jarrett
(74) *Attorney, Agent, or Firm* — Pearne & Gordon LLP

(57) ABSTRACT

A substrate transfer device that transfers a substrate by allowing a substrate opening formed on a front surface of a substrate transfer vessel to face an opening formed on a partition wall from one side of the partition wall and separating a cover body of the substrate transfer vessel from the other side of the partition wall includes a door configured to open and close the opening from the other side of the partition wall; a reciprocating unit configured to straightly move the door back and forth between a first position where the opening is closed and a second position away from the first position toward the other side of the partition wall; and a rotating unit configured to rotate the door around a rotation axis in a straightly moving direction of the door between the second position and a third position deviated from a region facing the opening.

11 Claims, 25 Drawing Sheets

SUBSTRATE TRANSFER DEVICE, SUBSTRATE TRANSFER METHOD, AND STORAGE MEDIUM

CROSS-REFERENCE TO RELATED APPLICATION

This application claims the benefit of Japanese Patent Application No. 2012-091111 filed on Apr. 12, 2012, the entire disclosures of which are incorporated herein by reference.

FIELD OF THE INVENTION

The present disclosure relates to a substrate transfer device that transfers a substrate between a substrate transfer region at a side of a partition wall and a transfer vessel to be transferred to the other side of the partition wall, a substrate transfer method, and a storage medium that stores a program for performing the substrate transfer method.

BACKGROUND OF THE INVENTION

By way of example, in a semiconductor device manufacturing process, there has been used a coating and developing apparatus that performs a resist coating process or a developing process on a semiconductor wafer (hereinafter, referred to as "wafer"). This coating and developing apparatus includes a carrier block to which a carrier is transferred from an outside, and the carrier block includes a loading port that transfers a wafer accommodated in the carrier into the coating and developing apparatus. In order to prevent particles from being introduced into the coating and developing apparatus from the outside, a wafer transfer region at an inside of the coating and developing apparatus is partitioned off from a carrier transfer region at the outside of the coating and developing apparatus by a partition wall of the loading port. At this partition wall, there is provided a wafer transfer opening. The wafer transfer opening is opened and closed by a door conforming to a FIMS (Front-opening Interface Mechanical Standard). Patent Document 1 describes such a loading port.

FIGS. 31 and 32 are longitudinal side views illustrating examples of a loading port and show a wafer transfer opening 22 in a closed state and in an opened state, respectively. As depicted in FIGS. 31 and 32, a door 91 is moved up and down to close and open the wafer transfer opening 22, and, thus, a height of the loading port is relatively increased. Therefore, if multiple loading ports are provided to quickly load many wafers W into the coating and developing apparatus, the loading ports are arranged transversely to prevent the carrier block from colliding with a ceiling of a clean room where the coating and developing apparatus is provided. Accordingly, a footprint (occupation area) of the carrier block and the coating and developing apparatus may be increased.

In FIGS. 31 and 32, a reference numeral 92 denotes a driving unit that moves the door 91 up and down. A reference numeral 93 denotes a partition member that partitions off the driving unit 92 from a wafer transfer region 17. A reference numeral 94 denotes a connection member that connects the door 91 with the driving unit 92. At the partition member 93, there is formed a slit 95 that is vertically extended to move the connection member 94. Since the slit 95 is long, it is difficult to prevent particles generated at the driving unit 92 from being introduced into the wafer transfer region 17.

Further, a reference numeral 6 denotes a mapping unit that checks an arrangement status of a wafer W in a carrier C, and an example thereof is described in Patent Document 2. The mapping unit 6 will be explained in detail in an illustrative embodiment. Briefly, the mapping unit 6 includes a sensor unit 65 configured to detect an arrangement status of the wafer W in the carrier C before the wafer W is unloaded from the carrier C. The sensor unit 65 is provided at a front end of a supporting arm 64. The supporting arm 64 is movable up and down and a base side of the supporting arm 64 is rotatable around a horizontal axis. The sensor unit 65 is moved back and forth between the wafer transfer region 17 and the inside of the carrier C by the rotation of the base side.

Since the door 91 is moved downwards from the wafer transfer opening 22 as described above, the supporting arm 64 is located at a standby position in an upright posture above the wafer transfer opening 22 as depicted in FIG. 31 in order not to interfere with the door 91. Then, after the wafer transfer opening 22 is opened, the supporting arm 64 is moved down, the sensor unit 65 is introduced toward a lower side within the carrier C, and then, the sensor unit 65 is moved up within the carrier C. During the upward movement, the sensor unit 65 performs optical detection on the wafer W. FIG. 32 illustrates the sensor unit 65 after the upward movement is completed.

However, in order to return the supporting arm 64 to the standby position depicted in FIG. 31 after the optical detection is performed, the supporting arm 64 needs to be moved downwards from a raised position within the carrier C depicted in FIG. 32 to prevent interference with a partition wall 18 and the carrier C. Then, the supporting arm 64 needs to be rotated to have the upright posture and moved upwards. If a door 91 is configured to be moved downwards with respect to the wafer transfer opening 22, arrangement of the mapping unit 6 is limited and an operation of the mapping unit 6 is limited accordingly. Therefore, it is difficult to reduce a time required for checking an arrangement status of the wafer. Patent Documents 1 and 2 do not describe various problems occurred when a door is moved upwards and downwards and cannot solve the problems.

Patent Document 1: Japanese Patent Laid-open Publication No. H10-125763

Patent Document 2: Japanese Patent Laid-open Publication No. 2008-108966

BRIEF SUMMARY OF THE INVENTION

In view of the foregoing, illustrative embodiments provide a method for reducing a height of a substrate transfer device.

In accordance with one aspect of an illustrative embodiment, there is provided a substrate transfer device that transfers a substrate by allowing a substrate opening formed on a front surface of a substrate transfer vessel to face an opening formed on a partition wall from one side of the partition wall and separating a cover body of the substrate transfer vessel from the other side of the partition wall. The substrate transfer device includes a door configured to open and close the opening from the other side of the partition wall; an attaching/detaching unit provided at the door and configured to detachably attach the cover body to the substrate transfer vessel; a reciprocating unit configured to straightly move the door back and forth between a first position where the opening is closed and a second position away from the first position toward the other side of the partition wall; and a rotating unit configured to rotate the door around a rotation axis in a straightly moving direction of the door between the second position and a third position deviated from a region facing the opening.

To be specific, the aspect of the illustrative embodiment will be described below.

(a) The rotating unit may include a rotating member of which one end side is fixed at the rotation axis and the other end side is fixed at a position eccentric from a center of the door in a horizontal direction and a vertical direction.

(b) Multiple sets containing the opening, the door, the reciprocating unit, and the rotating unit may be vertically arranged.

(c) Multiple sets containing the opening, the door, the reciprocating unit, and the rotating unit may be horizontally arranged.

(d) The third position may be set to be away from the second position in a horizontal direction.

(e) The third position may be set to be away from the second position in a vertical direction.

(f) The third position of one set of adjacent two sets containing the opening, the door, the reciprocating unit, and the rotating unit and the third position of the other set may be overlapped back and forth with each other.

(g) The substrate transfer device may further include a substrate detection unit having a sensor unit configured to detect the substrate positioned in a horizontal posture and an elevation unit configured to move the sensor unit up and down at the other side of the partition wall; and a controller configured to control the substrate detection unit and the rotating unit by outputting a control signal to the substrate detection unit and the rotating unit. Further, the controller may be configured to output a control signal such that an upward movement or a downward movement of the sensor unit and an opening operation of the opening by rotating the door are concurrently performed.

In accordance with the illustrative embodiments, the substrate transfer device includes the reciprocating unit and the rotating unit. The reciprocating unit is configured to straightly move back and forth the door provided at the opening formed on the partition wall between the first position where the opening is closed and the second position away from the first position toward the other side of the partition wall. Further, the rotating unit is configured to rotate the door around the rotation axis in the straightly moving direction of the door between the second position and the third position deviated away from the region facing the opening. With this configuration, it is not necessary to move the door up and down, and, thus, it is possible to suppress a height of the substrate transfer device required to open and close the door.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Figure 1:
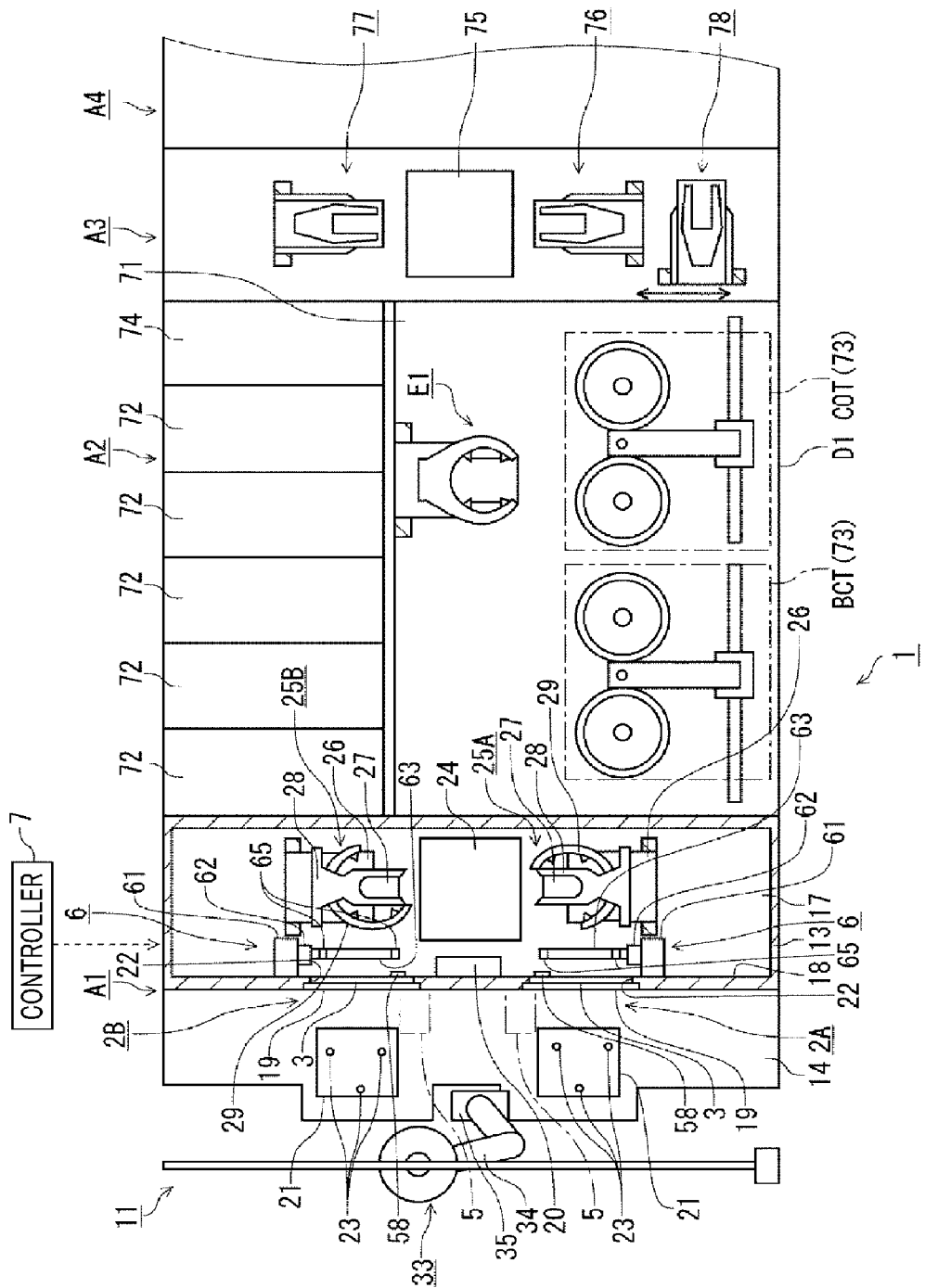
FIG. 1 is a plane view of a coating and developing apparatus to which an illustrative embodiment is applied.
Figure 2:
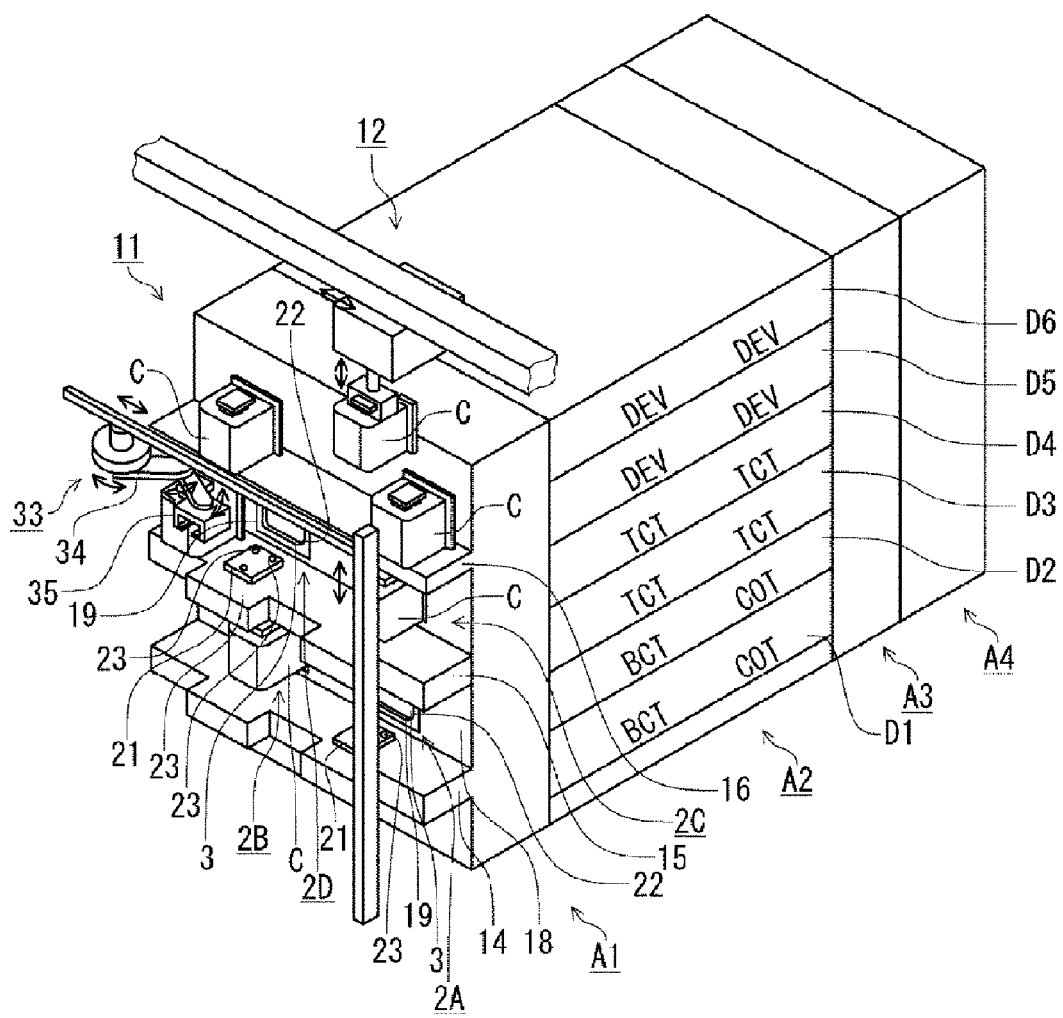
FIG. 2 is a perspective view of the coating and developing apparatus.
Figure 3:
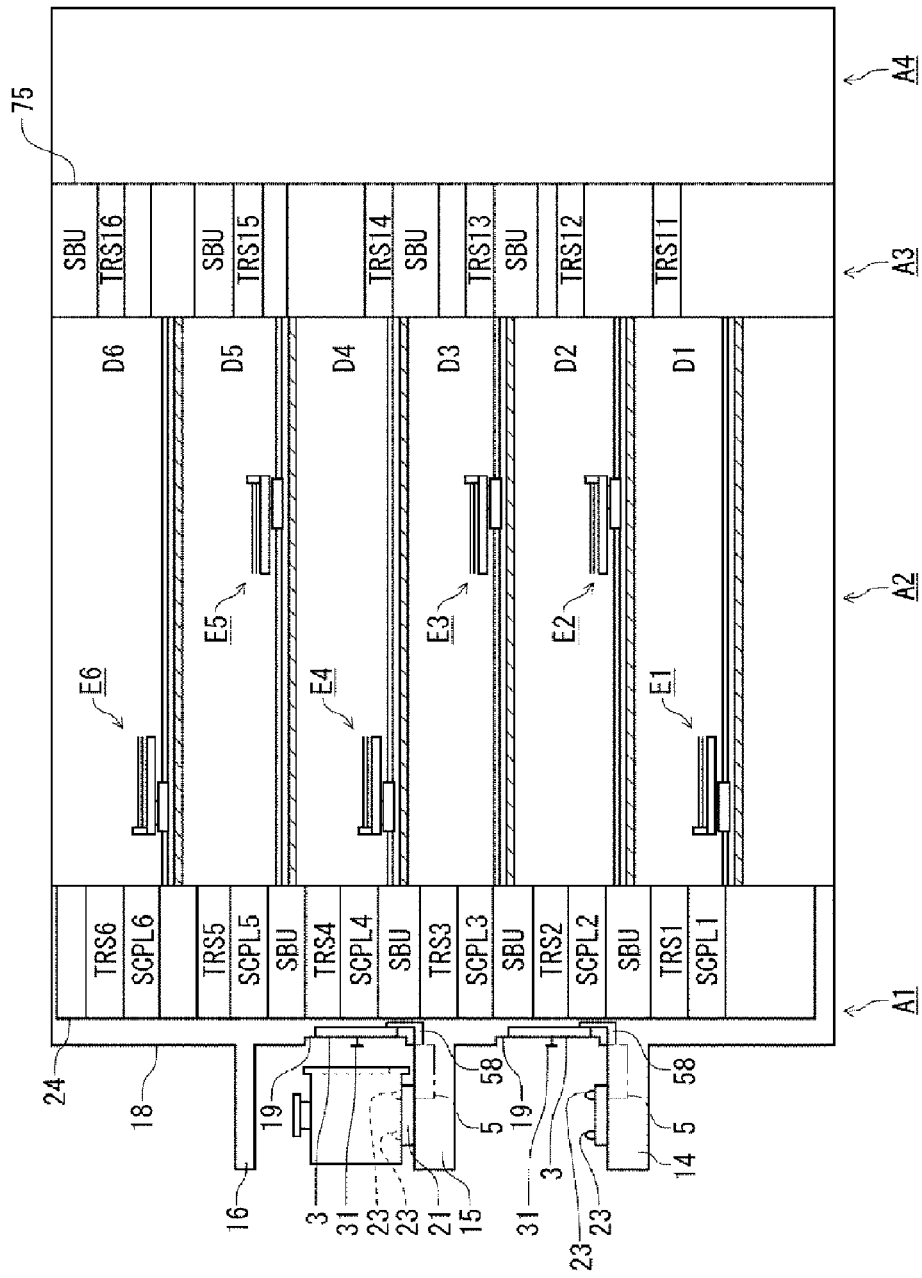
FIG. 3 is a side view of the coating and developing apparatus.

There will be explained a coating and developing apparatus 1 including a substrate transfer device of an illustrative embodiment. FIGS. 1, 2, and 3 are a front view, a schematic perspective view, and a schematic side view of the coating and developing apparatus 1, respectively. The coating and developing apparatus 1 includes a carrier block A1, a processing block A2, and an interface block A3, which are linearly connected to each other. The interface block A3 is connected to an exposure device A4 opposite to the processing block A2. An outside of the coating and developing apparatus 1 serves as a transfer region 11 of a carrier C, and the carrier C is a substrate transfer vessel configured to accommodate therein a wafer W.

A function of each block will be explained briefly. The carrier block A1 serves as a substrate transfer device of an illustrative embodiment and transfers the carrier C that accommodates the wafer W to and from a ceiling transfer unit 12 depicted in FIG. 2. Then, the carrier block A1 loads the wafer W from the transferred carrier C into the coating and developing apparatus 1 and returns the wafer W processed in the coating and developing apparatus 1 back to the carrier C. The ceiling transfer unit 12 passes through a ceiling of a clean room to transfer the carrier C between respective devices provided within the clean room. The processing block A2 is configured to perform various liquid processes such as a resist coating process and a developing process or a heating process on the wafer W. The exposure device A4 exposes a resist film formed on the wafer W in the processing block A2. The interface block A3 transfers the wafer W between the processing block A2 and the exposure device A4.

A configuration of the carrier block A1 will be explained. For convenience of explanation, the carrier block A1's side will be referred to as a front side and the exposure device A4's side will be referred to as a rear side. The carrier block A1 includes a housing 13 and an inside of the housing 13 is partitioned off from the carrier transfer region 11. The housing 13 includes vertical three-stage racks where a front surface of a rectangle-shaped block is protruded toward the front side. A lower rack, an intermediate rack, and an upper rack are carrier mounting racks 14, 15, and 16, respectively. Within the housing 13, a space at a rear side of the carrier mounting racks 14 to 16 serves as a wafer transfer region 17.

Figure 4:
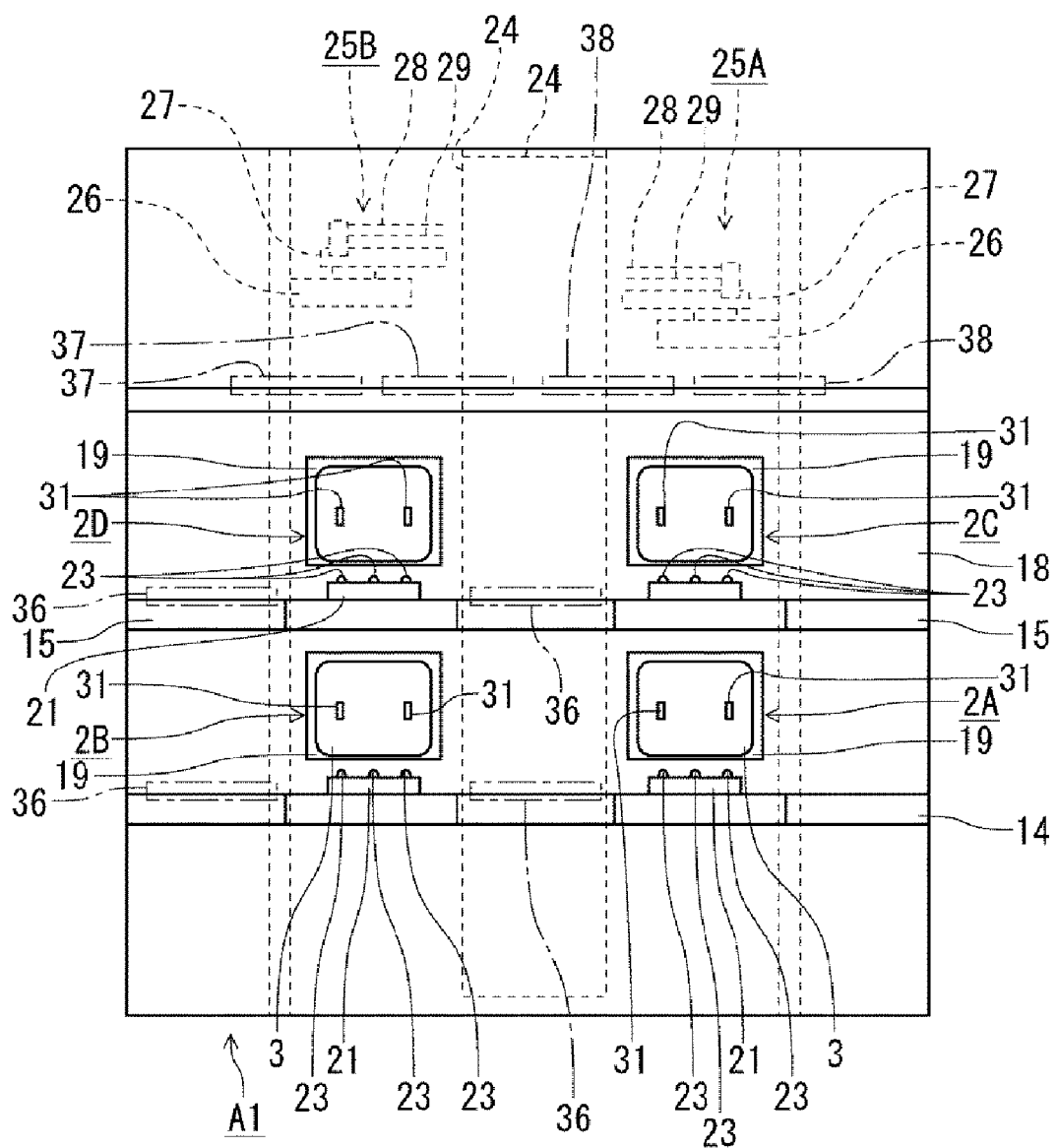
FIG. 4 is a front view of a carrier block constituting the coating and developing apparatus.

FIG. 4 illustrates a front side of the carrier block A1. Referring to FIG. 4, a front surface of the housing 13 is configured as a loading port 2 to load the wafer W from the carrier C. The loading port 2 includes a stage 21 that mounts thereon the carrier C, a wafer transfer opening 22, a door 3 that opens and closes the wafer transfer opening 22, and a mapping unit 6. In the carrier block A1, four loading ports 2 are provided. For convenience of description, the loading ports 2 are denoted by reference numerals 2A to 2D, respectively. The loading ports 2 are provided up and down and right and left to be away from one another in a front view of the carrier block A1. A lower right side loading port is denoted by 2A, a lower left side loading port is denoted 2B, an upper right side loading port is denoted by 2C, and an upper left side loading port is denoted by 2D. The loading ports 2A and 2B are provided at the same height and the loading ports 2C and 2D are provided at the same height. The loading ports 2A and 2C are provided at the same positions in the horizontal direction and the loading ports 2B and 2D are provided at the same positions in the horizontal direction.

The wafer transfer opening 22 of each loading port 2 is opened through a front side partition wall 18 forming the housing 13 in a forward and backward direction. The wafer transfer openings 22 of the loading ports 2A and 2B are formed between the carrier mounting racks 14 and 15, and the wafer transfer openings 22 of the loading ports 2C and 2D are formed between the carrier mounting racks 15 and 16. Each wafer transfer opening 22 has a transversely long rectangular shape in a plane view. At the front side of the partition wall 18, an annular recess 19 is formed around each wafer transfer opening 22. When the wafer W is transferred, a front surface of the carrier C is close to a front surface of the recess 19.

The stages 21 are provided in front of the respective wafer transfer openings 22 on the carrier mounting racks 14 and 15, respectively. These stages 21 can be moved between a retreat position and a progress position. The retreat position (unloading position) is a position where the carrier C is transferred between the stages 21 and a carrier transfer unit 33 to be described later. The progress position (loading position) is a position where the carrier C is close to the recess 19 to transfer the wafer W. In FIG. 4, a reference numeral 23 denotes a pin provided on the stage 21. The pin 23 is inserted into a recess formed at a lower portion of the carrier C so that the position of the carrier C on the stage 21 can be prevented from being deviated.

Figure 5:
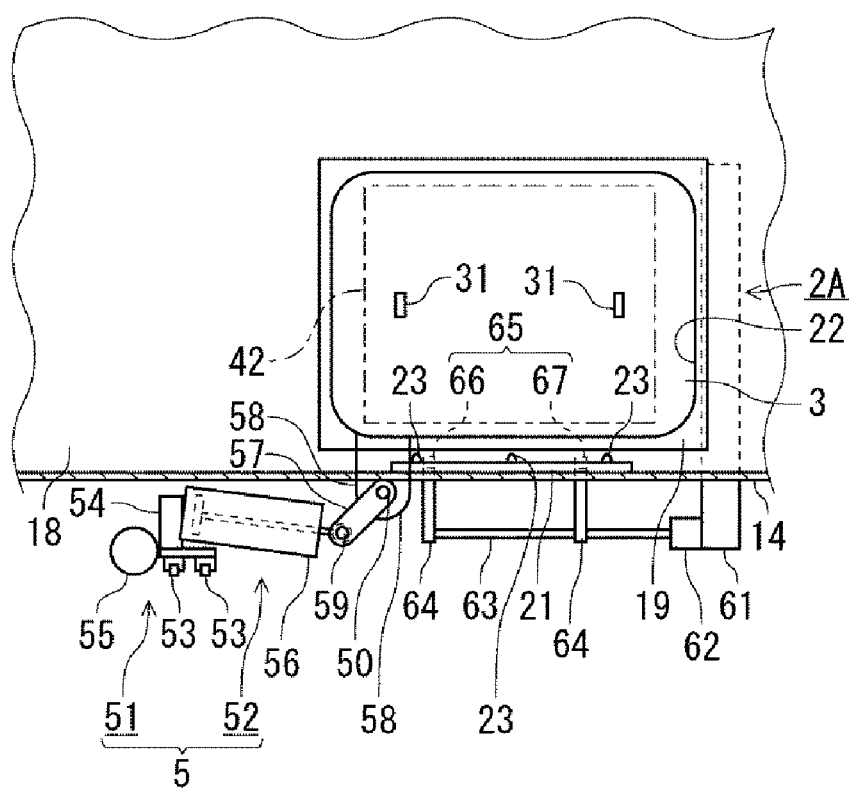
FIG. 5 is a front view of a door of a loading port provided at the carrier block.
Figure 6:
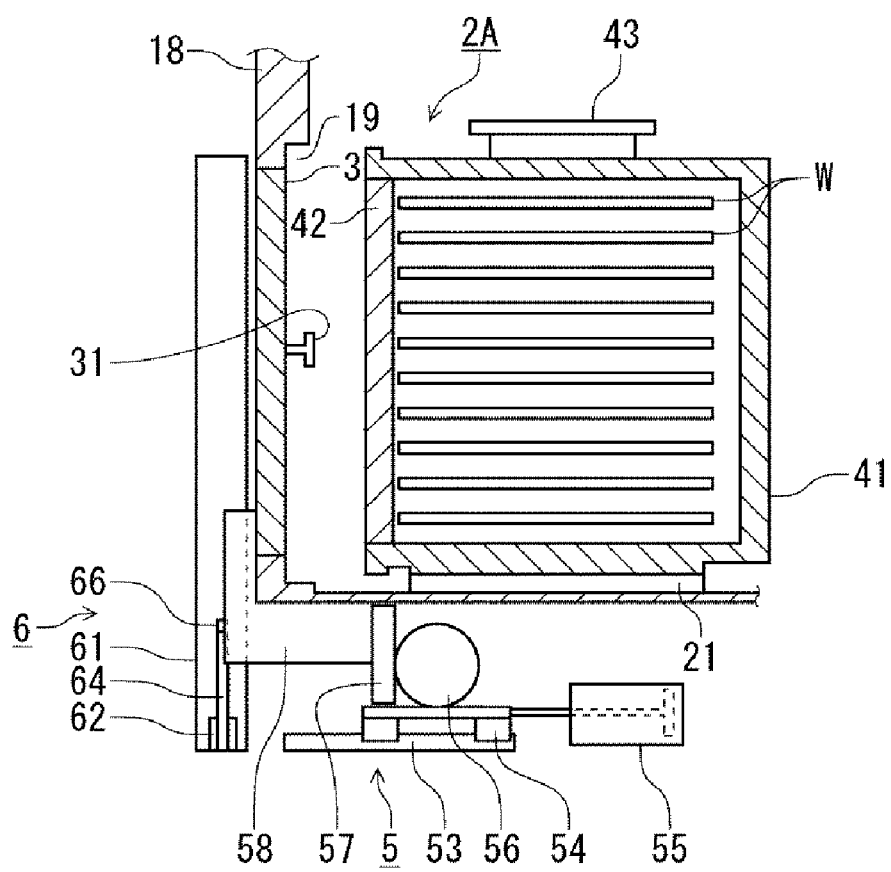
FIG. 6 is a longitudinal side view of the loading port.
Figure 7:
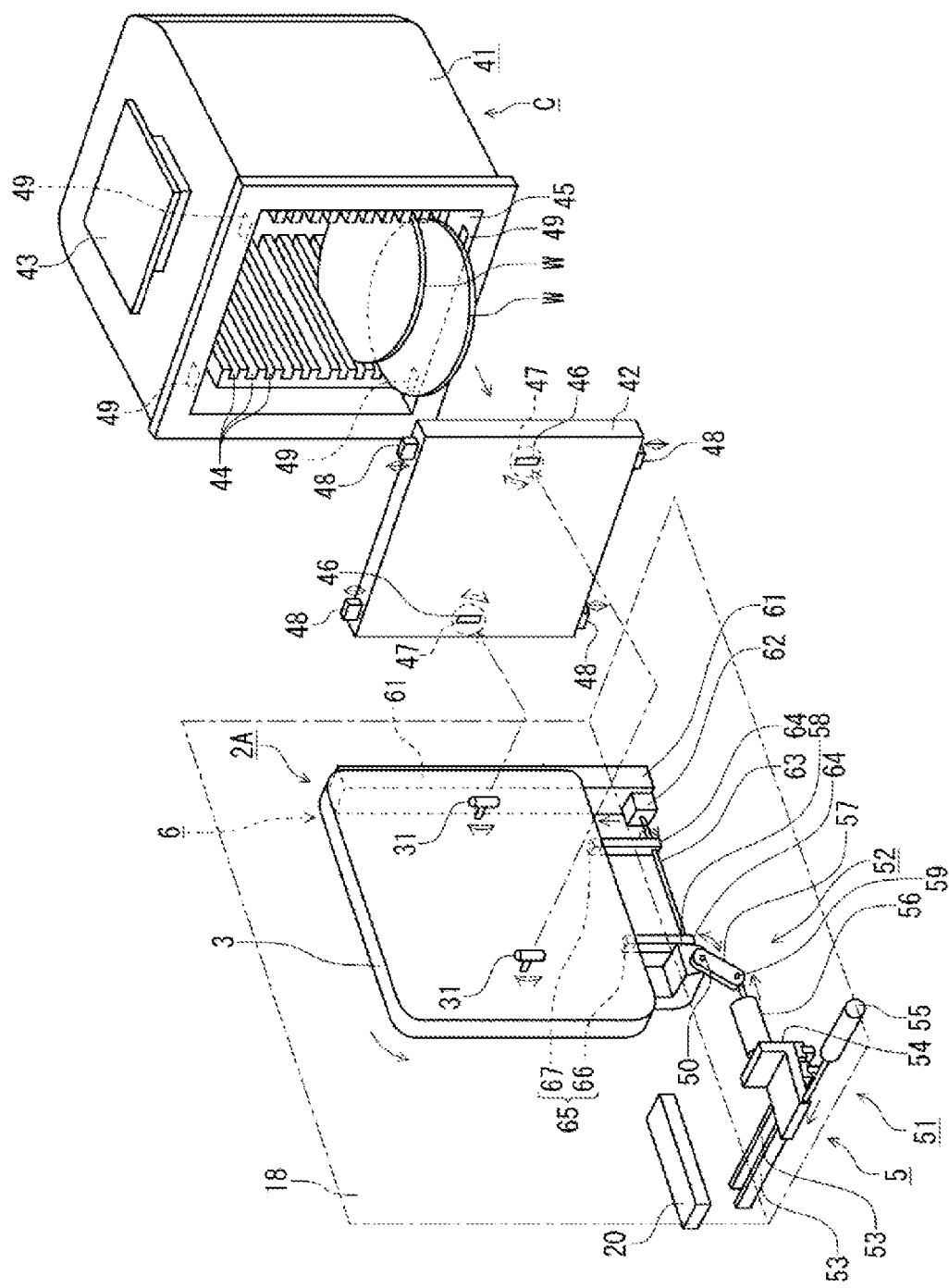
FIG. 7 is a perspective view of a door when a wafer transfer opening is closed.

The loading ports 2 have substantially the same configuration. Hereinafter, the loading port 2A will be representatively explained. FIGS. 5, 6, and 7 are a front view, a longitudinal side view, and a perspective view of the door 3 of the loading port 2A, respectively. The door 3 has a substantially rectangular shape to close the wafer transfer opening 22. On the front surface of the door 3, there are provided keys 31 forming an attaching/detaching unite configured to detachably attach a cover body 42 of the carrier C. The keys 31 are provided at the right and the left side of the front surface of the door 3, and extended vertically. The key 31 is capable of being rotated about an axis in the front and rear side direction.

A configuration of the carrier C will be explained with reference to FIG. 7. The carrier C includes a vessel main body 41 having a substantially rectangular shape and the cover body 42 having a rectangular plate shape. Above the vessel main body 41, there is provided a to be held portion 43 by the ceiling transfer unit 12 and the carrier transfer unit 33 to transfer the carrier C. On both sides within the vessel main body 41, inward protrusions are provided at multiple levels. A periphery of a wafer W is inserted into a slot 44 between the inward protrusions, and, thus, wafers W are horizontally held at multiple levels. At a front surface of the vessel main body 41, there is formed a wafer opening 45 through which the wafer W is taken out. The cover body 42 is configured to close the opening 45.

At a front surface of the cover body 42, there is formed an insertion opening 46 to which the key 31 is inserted. If the key 31 is rotated while being inserted into the insertion opening 46, a rotating unit 47 within the cover body 42 is rotated, so that claws 48 are protruded and retreated at upper and lower side portions of the cover body 42. When the claws 48 protruding from the upper and lower side portions are inserted into grooves 49 formed at upper and lower inner peripheries of the opening 45, the cover body 42 is engaged with the vessel main body 41. When the claws 48 get into the side portions of the cover body 42 and are not engaged with the grooves 49, the engagement between the cover body 42 and the vessel main body 41 is released and the cover body 42 is held by the key 31 inserted into the insertion opening 46.

To resume the explanation of the loading port 2A, the loading port 2A includes a door opening/closing driving unit 5 within the carrier mounting rack 14. The door opening/closing driving unit 5 includes a reciprocating unit 51 that straightly moves the door 3 back and forth with respect to the wafer transfer opening 22 and a rotating unit 52 that is provided at the reciprocating unit 51 and configured to rotate the door 3 when the door 3 is moved back. The reciprocating unit 51 includes a guide rail 53, a slider 54, and a cylinder 55. The guide rail 53 is extended in a forward and backward direction and the slider 54 is engaged with the guide rail 53. The cylinder 55 is extensible and contractible in a forward and backward direction, so that the slider 54 connected to the cylinder 55 is moved back and forth along the guide rail 53.

The rotating unit 52 is provided at the slider 54 and includes a cylinder 56, a link member 57, and a door connection member 58 serving as a rotation member. The cylinder 56 is provided at the slider 54 and is transversely extensible and contractible. The link member 57 is connected to ends of the cylinder 56 and the door connection member 58, and includes a shaft 59 connected to the cylinder 56 and a shaft 50 connected to the door connection member 58. The respective shafts 59 and 50 are provided in a forward and backward direction. As depicted in FIG. 6, the door connection member 58 has an L-shape in a side view and an end thereof is extended backwards and bent upwards. The door connection member 58 is fixed at a lower portion of a rear surface of the door 3. A fixed position of the door connection member 58 at the door 3 is near a central area of the carrier block A1 as viewed transversely. That is, the fixed position is eccentric from a center of the door 3 in a horizontal direction and a vertical direction.

Figure 8:
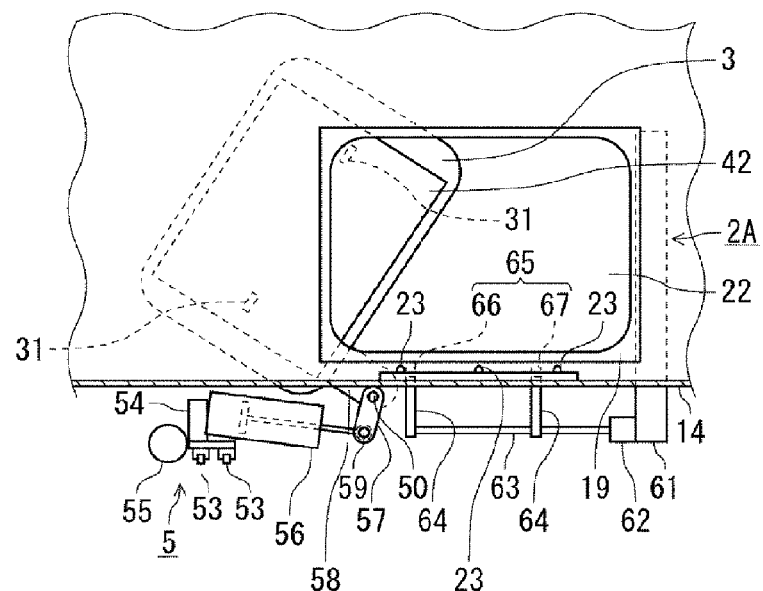
FIG. 8 is a front view illustrating the door while the wafer transfer opening is being opened.
Figure 9:
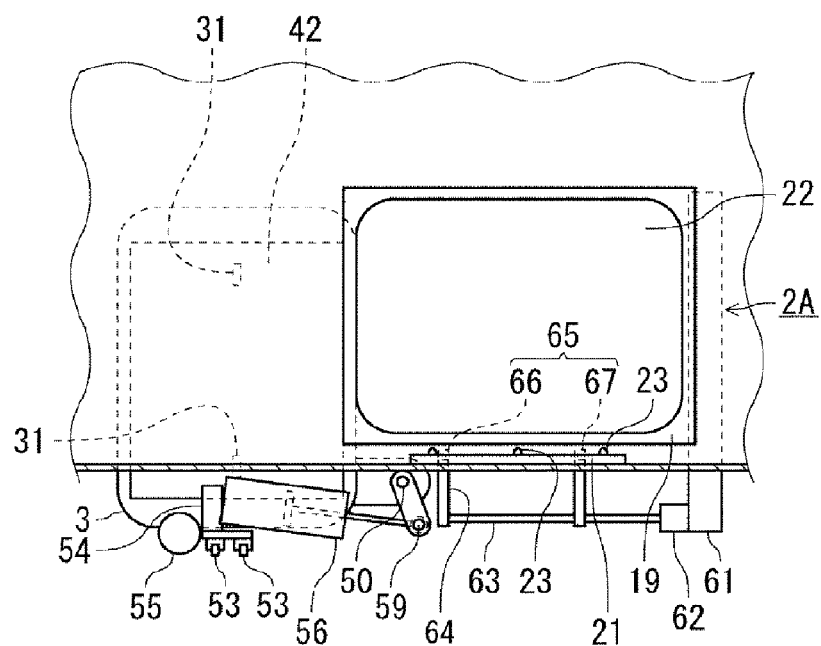
FIG. 9 is a front view of the wafer transfer opening opened by the door.
Figure 10:
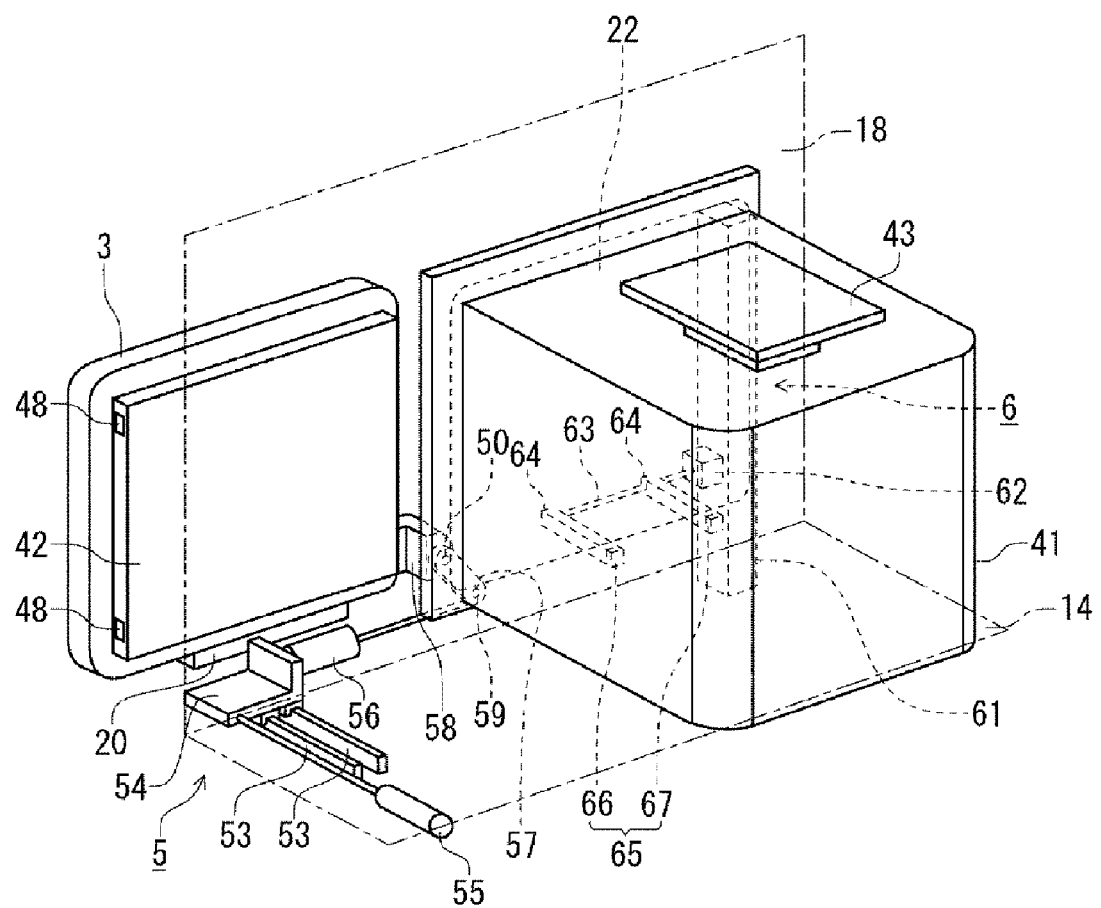
FIG. 10 is a perspective view of the door when the wafer transfer opening is opened.

When the cylinder 56 is extended and contracted, the link member 57 is rotated around the shaft 59 and inclination thereof is changed. Such a change in inclination of the link member 57 is converted into rotation of the door 3 around the shaft 50. FIGS. 8 and 9 illustrate a status where the door 3 is being opened by the rotation. As depicted in FIGS. 8 and 9, when a side portion of the door 3 faces downwards and the door 3 is rotated to fall down toward an inside of the carrier block A1, the wafer transfer opening 22 is opened. FIG. 10 is a perspective view illustrating the door 3 when the wafer transfer opening 22 is opened. In FIG. 10 and other drawings, a reference numeral 20 denotes a supporting member configured to support the door 3 when the wafer transfer opening 22 is opened.

The mapping unit 6 will be explained hereinafter. The mapping unit 6 is provided at the wafer transfer region 17. The mapping unit 6 is configured to check an arrangement status of the wafer W in the carrier C after the wafer transfer opening 22 is opened and before the wafer W is loaded into the wafer transfer region 17 from the carrier C. While checking an arrangement status, the mapping unit 6 checks whether or not there is the wafer W in each slot 44 in the carrier C and whether or not the accommodated wafer W has a horizontal posture or a inclined posture. The mapping unit 6 includes an elevation unit 61, a rotating unit 62, a supporting shaft 63, supporting arms 64 and 64, and a sensor unit 65.

The elevation unit 61 is provided to longitudinally extend at an outer portion of the wafer transfer opening 22. The rotating unit 62 is configured to be moved up and down by the elevation unit 61 and closer to the wafer transfer opening 22 than the elevation unit 61. The supporting shaft 63 is transversely extended toward the wafer transfer opening 22 from the rotating unit 62 and rotated around an axis by the rotating unit 62. The two supporting arms 64 are extended from the supporting shaft 63 to be orthogonal to an axial direction of the supporting shaft 63. The supporting arms 64 and 64 are provided to be in parallel to each other with a space therebetween. The sensor unit 65 is provided at a front end of each supporting arm 64. The sensor unit 65 includes a light emitting unit 66 and a light receiving unit 67 paired with each other. Either one of the light emitting unit 66 and the light receiving unit 67 is provided at the supporting arm 64.

Figure 11:
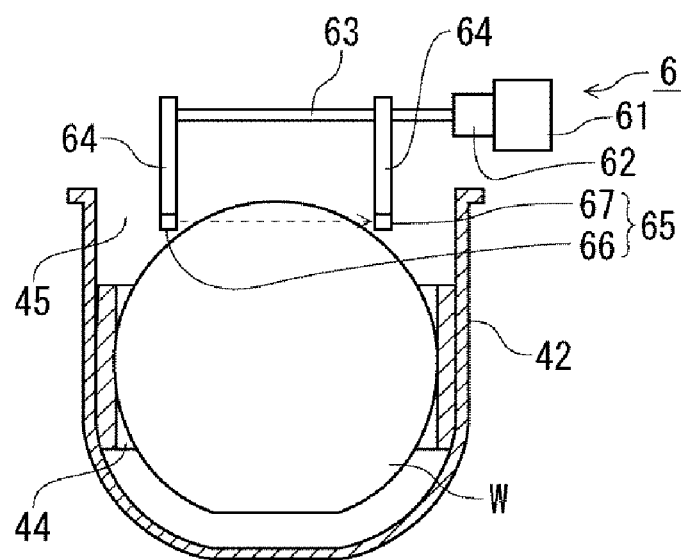
FIG. 11 is a transversal plane view of a carrier.
Figure 12:
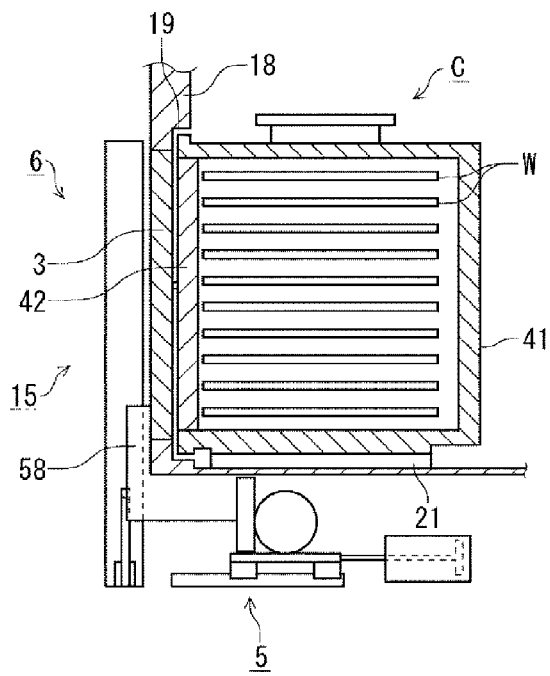
FIG. 12 is a process diagram illustrating opening of the wafer transfer opening and unloading of a wafer by the door.

FIG. 11 is a transversal plane view of the carrier C. When an arrangement status of the wafer W in the carrier C is checked, the supporting arms 64 and 64 have a horizontal posture and as depicted in FIG. 11, the light emitting unit 66 and the light receiving unit 67 are introduced into the carrier C. An optical axis indicated by a dotted arrow in FIG. 11 is formed between the light emitting unit 66 and the light receiving unit 67 to be superposed onto the wafer W accommodated in the carrier C in a plane view.

The light receiving unit 67 transmits a detection signal to a controller 7 to be described later depending on whether or not light is received from the light emitting unit 66. Further, when the optical axis is formed, the sensor unit 65 is moved upwards and the controller 7 detects whether or not there is a wafer W in each slot 44 based on the detection signal. If an end side and the other end side of the wafer W are introduced into the slots 44 having different heights so that the wafer W is slantly held, an apparent thickness of the wafer W is increased as compared with a case where the wafer W is horizontally held. Therefore, the controller 7 can detect whether or not there is inclination of the wafer W. Except a case where an arrangement status of the wafer W is checked, the supporting arms 64 and the sensor unit 65 wait at a standby position at an outside of a lower side of the wafer transfer opening 22 depicted in FIG. 5 in order not to interfere with the transfer of the wafer W.

The loading ports 2B to 2D will be explained hereinafter. The door 3 of the loading port 2B is rotated toward the inside of the carrier block A1. That is, the doors 3 of the loading ports 2A and 2B are rotated to be overlapped with each other and the wafer transfer openings 22 are opened. The loading ports 2C and 2D have the same configurations as the loading ports 2A and 2B, respectively, except that the door opening/closing driving unit 5 is provide within the carrier mounting rack 15. In the present illustrative embodiment, the loading ports 2A and 2C are configured to load the wafer W into the coating and developing apparatus 1 from the carrier C. The loading ports 2B and 2D are configured to return the processed wafer W to the carrier C.

However, as depicted in FIGS. 1 and 2, the carrier block A1 includes the carrier transfer unit 33 at a side of the carrier transfer region 11. The carrier transfer unit 33 includes a multi-joint arm 34 of which a base side can be transversely moved or can be moved up and down; and a holding unit 35 that is provided at a front end side of the multi-joint arm 34 and holds the to be held portion 43 of the carrier C. The carrier C is transferred by the carrier transfer unit 33 between the stages 21 of the respective loading ports 2 and mounting regions 36 to 38 formed on the respective carrier mounting racks 14 to 16. The mounting regions 36 to 38 will be described later.

FIG. 4 illustrates a mounting region of the carrier C indicated by a dashed-dotted frame except the stages 21 on the carrier mounting racks 14 to 16. The carrier mounting rack 14 includes two mounting regions 36 and 36, and these mounting regions 36 are respectively formed between the stages 21 of the loading ports 2A and 2B and on the left side of the stage 21 of the loading port 2B. Further, the carrier mounting rack 15 includes two mounting regions 36 and 36, and these mounting regions 36 are respectively formed between the stages 21 of the loading ports 2C and 2D and on the left side of the stage 21 of the loading port 2D. Although the mounting regions 36 are respectively formed on the left side of the loading ports 2A to 2D, the illustrative embodiment is not limited to such arrangement. By way of example, the mounting regions 36 may be formed on the right side of the respective loading ports 2A to 2D.

On the carrier mounting rack 16, four mounting regions are formed. Two mounting regions 37 on a left side thereof are configured to load carriers C into the coating and developing apparatus 1. The carriers C are transferred to the mounting regions 37 from the ceiling transfer unit 12. Two mounting regions 38 on a right side thereof are configured to unload the carriers C from the coating and developing apparatus 1 to other apparatuses. The carriers C mounted on the mounting regions 38 are received by the ceiling transfer unit 12 and transferred to other apparatuses.

When the carriers C are transferred from the ceiling transfer unit 12 to the mounting regions 37, if other carriers C are mounted on the stages 21 of the loading ports 2A and 2C and the carriers C cannot be transferred to the stages 21, the carriers C on the mounting regions 37 are transferred to the mounting regions 36 and temporarily mounted thereon. When the stages 21 of the loading ports 2A and 2C are empty, the temporarily mounted carriers C are transferred from the mounting regions 36 to the stages 21. If carriers C that unloads wafers W from the loading ports 2A and 2C cannot be transferred to the stages 21 of the loading ports 2B and 2D since other carriers C are already mounted thereon, the carriers C that unloads wafers W are transferred to the mounting regions 36 and temporarily mounted thereon. When the stages 21 of the loading ports 2B and 2D are empty, the carriers C are transferred from the mounting regions 36 to the stages 21.

The carriers C are transferred as follows. The carriers C mounted on the mounting regions 37 by the ceiling transfer unit 12 are transferred by the carrier transfer unit 33 from the stages 21 of the loading ports 2A and 2C to the stages 21 of the loading ports 2B and 2D, and to the mounting regions 38 in this sequence. Then, the carriers C are transferred by the ceiling transfer unit 12 to other apparatuses. In this transfer route, when the loading port 2 of a transfer target location is closed, the carrier transfer unit 33 transfers the carriers C to the mounting regions 36 to be on standby and then transfers the carriers C to the loading port 2.

The wafer transfer region 17 within the housing 13 will be explained hereinafter. At a central area of the wafer transfer region 17 in a transversal direction, there is provided a transfer unit 24 of the wafer W. The transfer unit 24 has a configuration in which transfer modules TRS and SCPL and buffer modules SBU are stacked at multiple levels. The transfer modules TRS and SCPL are configured to transfer a wafer W with respect to the processing block A2, and the buffer modules SBU are configured to stay a wafer W temporarily. In FIG. 3, TRSs and SCPLs of the transfer unit 24 are assigned numerals corresponding to respective levels of unit blocks of the processing block A2, and the unit blocks will be described later. That is, a TRS and a SCPL provided at a unit block D1 of a lowest first level are expressed as a TRS1 and a SCPL1, and another TRS and another SCPL provided at another unit block is assigned a level number of a unit block as described above.

As depicted in FIGS. 1 and 4, wafer transfer units 25A and 25B are respectively provided at both sides of the transfer unit 24. The wafer transfer unit 25A transfers wafers W between the carriers C of the loading ports 2A and 2C and the respective modules of the transfer unit 24. The wafer transfer unit 25B transfers wafers W between the carriers C of the loading ports 2B and 2D and the respective modules of the transfer unit 24.

The wafer transfer unit 25A will be explained hereinafter. The wafer transfer unit 25A includes an elevation member 26 that is movable up and down; a base 27 that is rotatable around a vertical axis above the elevation member 26; and forks 28 and 29 that are independently movable back and forth above the base 27. The fork 28 is used to transfer the wafer W to and from the carrier C, the transfer module TRS, and the buffer module SBU. The fork 29 is used to transfer the wafer W to and from the carrier C and the transfer module SCPL. The wafer transfer unit 25B has the same configuration as the wafer transfer unit 25A except that the wafer W is transferred between the carriers C of the loading ports 2B and 2D and the respective modules of the transfer unit 24.

The coating and developing apparatus 1 includes the controller 7 formed of, for example, a computer. The controller 7 includes a data processing unit having a program, a memory, and a CPU. The program contains an instruction (each step) for performing an opening/closing operation of the door 3, a transfer of the wafer W, and each process in a process module by transmitting a control signal to each component, such as the door opening/closing driving unit 5, of the coating and developing apparatus 1 from the controller 7. The program is stored in a computer storage medium such as a flexible disk, a compact disk, a hard disk, a MO (magneto-optical) disk memory card or the like and installed in the controller 7.

The processing block A2, the interface block A3, and the exposure device A4 will be explained with reference to FIGS. 1 to 3. The processing block A2 includes unit blocks D1 to D6 stacked at six levels. Each of the unit blocks D1 to D6 includes a wafer transfer region 71 extended toward the rear side from the front side, a heating module 72 provided on a left side of the wafer transfer region 71, and a liquid processing module 73 provided on a right side of the wafer transfer region 71 as viewed from the front. The heating module 72 and the liquid processing module 73 are plural in number along the wafer transfer region 71. The heating modules 72 perform a heating process on the wafer W and the liquid processing modules 73 supply a processing liquid to the wafer W.

At the wafer transfer region 71, a main transfer unit E of the wafer W is provided. The main transfer unit E transfers the wafer W between each module of a unit block where the main transfer unit E is provided and a transfer module provided at the same height as the unit block in the transfer unit 24 and a transfer unit 75 to be described later. In FIG. 3, main transfer units of the unit blocks D1 to D6 are denoted by E1 to E6, respectively. The liquid processing module 73 of the unit blocks D1 and D2 includes a module BCT configured to form an antireflection film by supplying a chemical liquid to the wafer W and a module COT configured to coat the wafer W with resist. The liquid processing module 73 of the unit blocks D3 and D4 includes a module TCT configured to form a protection film by supplying a chemical liquid to the wafer W. The liquid processing module 73 of the unit blocks D5 and D6 includes a module DEV configured to develop the wafer W by supplying a developing liquid to the wafer W. Further, at the unit blocks D1 and D2, a peripheral exposure module 74 is provided in a vicinity of the heating module 72.

The interface block A3 will be explained hereinafter. The interface block A3 includes the transfer unit 75. The transfer unit 75 includes transfer modules TRS and buffer modules SBU that accommodate multiple wafers W. In FIG. 3, transfer modules provided corresponding to the unit blocks D3 to D6 are denoted by TRS13 to TRS16, respectively, and transfer modules configured to load and unload the wafer W with respect to the exposure device A4 are denoted by TRS11 and TRS12, respectively. At both sides of the transfer unit 75, there are respectively provided interface arms 76 and 77 that transfer the wafer W between the modules of the transfer unit 75. Further, there is provided an interface arm 78 that transfers the wafer W between the exposure device A4 and the transfer modules TRS of the transfer unit 75.

There will be explained a transfer route of the wafer W, which is transferred to the transfer modules TRS1 and TRS2 in the transfer unit 24 as loading modules with respect to the processing block A2, among the blocks A2 to A4. The wafer W transferred to the transfer module TRS1 is introduced into the unit block D1 by the main transfer unit E1 and transferred to the transfer module SCPL1, the antireflection film forming module BCT, the heating module 72, the transfer module SCPL1, the resist coating module COT, the heating module 72, the peripheral exposure module 74, and the transfer module SCPL1 in this sequence. Thus, an antireflection film and a resist film are formed in sequence on a surface of the wafer W, and a periphery of the resist film is exposed. Then, the wafer W is transferred to the transfer module TRS3 or TRS4 by the wafer transfer units 25A and 25B.

The wafer W in the transfer module TRS2 is transferred in the same manner as the wafer W transferred to the transfer module TRS1 except that the wafer W is introduced into a unit block D2 by the main transfer unit E2 and transferred to the transfer module SCPL2 instead of the transfer module SCPL1 and then transferred from the transfer module SCPL2 to the transfer modules TRS3 and TRS4.

The wafer W transferred to the transfer module TRS3 is introduced into a unit block D3 by the main transfer unit E3 and transferred to the transfer module SCPL3, the protection film forming module TCT, the heating module 72, and the transfer module TRS13 of the transfer unit 75. Thus, an antireflection film is formed on the resist film and the wafer W is loaded into the interface block A3. The wafer W in the transfer module TRS4 is transferred in the same manner as the wafer W transferred to the transfer module TRS3 except that the wafer W is introduced into a unit block D4 by the main transfer unit E4 and transferred to the transfer modules SCPL4 and TRS14 instead of the transfer modules SCPL3 and TRS13.

The wafers W in the transfer modules TRS13 and TRS14 are transferred to the interface arm 76, the buffer module SBU, the interface arm 77, the transfer module TRS11, the interface arm 78, and the exposure device A4 in this sequence. After an exposure process, the wafers W are transferred in sequence to the interface arm 78, the transfer module TRS12, the interface arm 76, the buffer module SBU, the interface arm 77, and the transfer module TRS15 or TRS16.

The wafer W in the transfer module TRS15 is introduced into a unit block D5 by the main transfer unit E5 and transferred to the heating module 72, the transfer module SCPL5, the developing module DEV, and the transfer module TRS5 in this sequence. After an exposure process, a heating process and a developing process are performed on the wafer W. The wafer W in the transfer module TRS16 is transferred in the same manner as the wafer W transferred to the transfer module TRS15 except that the wafer W is introduced into a unit block D6 by the main transfer unit E6 and transferred to the transfer modules SCPL6 and TRS6 instead of the transfer modules SCPL5 and TRS5.

Hereinafter, there will be explained an opening operation of the wafer transfer opening 22 in the carrier block A1 and a loading/unloading operation of the wafer W with respect to the carrier block A1. Herein, there will be explained a case where a carrier C is first transferred to the loading port 2A to unload a wafer W and another carrier C is transferred to the loading port 2B to load a wafer W already processed in the coating and developing apparatus 1. FIGS. 12 to 18 are longitudinal side views of the loading port 2A, and FIGS. 19 to 22 are transversal plane views of the loading ports 2A and 2B. Explanations will be provided with reference to these drawings together with FIG. 6. If the carrier C is mounted on the stage 21 at the retreat position (FIGS. 6 and 19), the stage 21 is moved toward the progress position and the key 31 of the door 3 is inserted into the insertion opening 46 of the cover body 42 of the carrier C. If the stage 21 is continuously moved and a front periphery of the vessel main body 41 is close to a front surface of the recess 19 as an entrance of the wafer transfer opening 22 (FIG. 12), the key 31 is rotated and engagement between the vessel main body 41 and the cover body 42 is released and the cover body 42 is held by the door 3 via the key 31.

Figure 13:
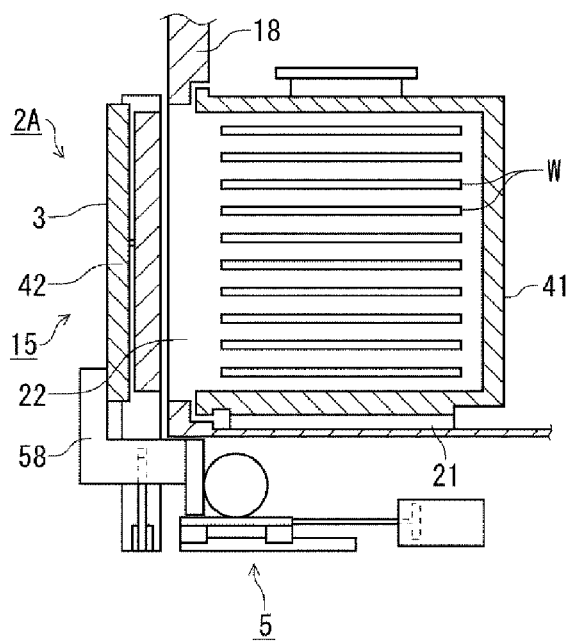
FIG. 13 is a process diagram illustrating opening of the wafer transfer opening and unloading of the wafer by the door.
Figure 14:
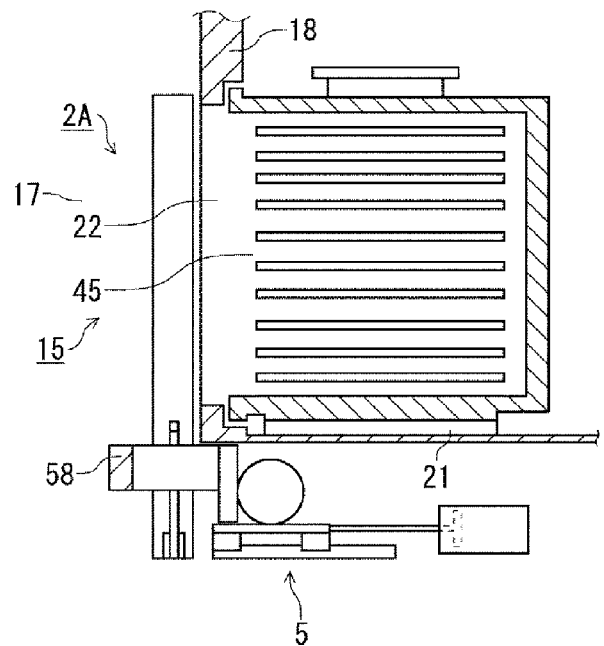
FIG. 14 is a process diagram illustrating opening of the wafer transfer opening and unloading of the wafer by the door.
Figure 20:
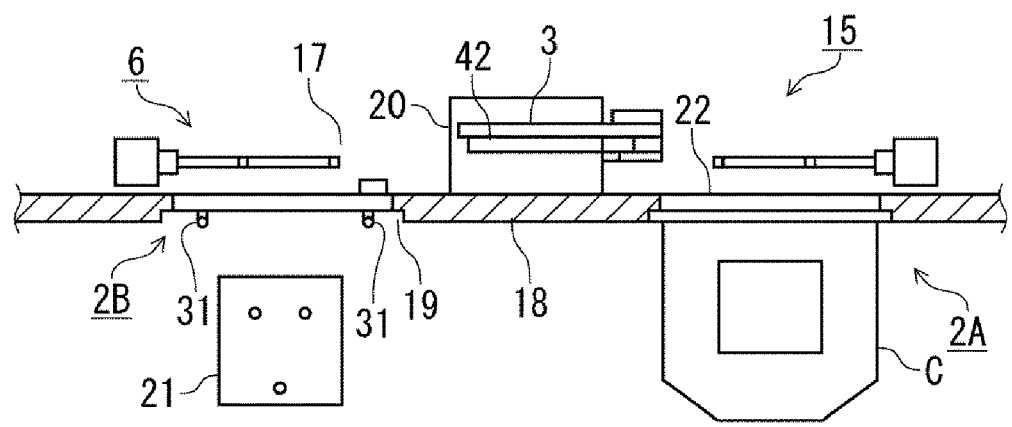
FIG. 20 is a process diagram illustrating loading of the carrier into the respective loading ports arranged transversely.
Figure 21:
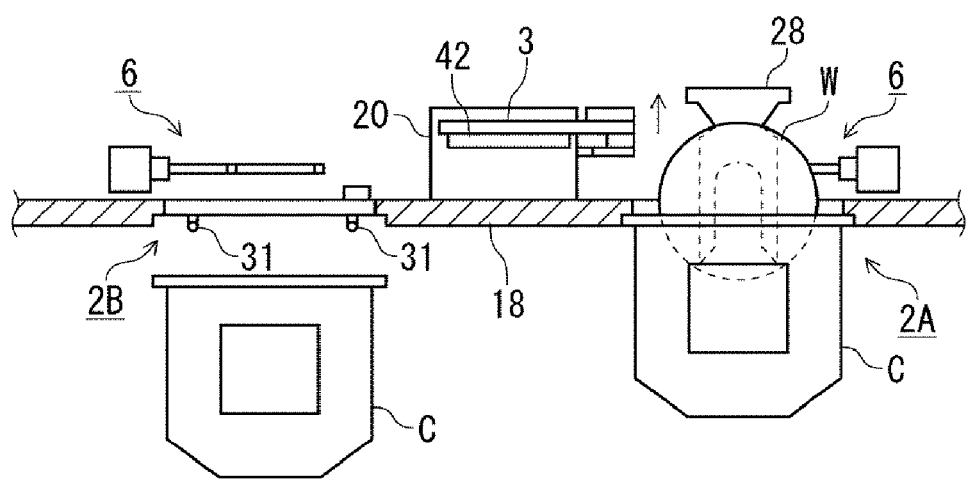
FIG. 21 is a process diagram illustrating loading of the carrier into the respective loading ports arranged transversely.

The door 3 is moved backwards by the door opening/closing driving unit 5, and the cover body 42 held by the door 3 is moved to pass through the partition wall 18 to be positioned at the wafer transfer region 17 (FIG. 13). Then, the door 3 is rotated around a rotation axis in the front and rear direction of the wafer transfer opening 22 and the wafer transfer opening 22 is opened. The door 3 is supported by the supporting member 20 (FIGS. 14 and 20). In this case, an entrance of the vessel main body 41 is close to the recess 19 of the partition wall 18. Further, a pressure in the wafer transfer region 17 is controlled to be higher than a pressure of the carrier transfer region 11 by a non-illustrated pressure controller. As a result, it is possible to prevent an atmosphere of the carrier transfer region 11 from being introduced into the vessel main body 41 and the wafer transfer region 17 through a gap between the partition wall 18 and the entrance of the vessel main body 41.

Figure 15:
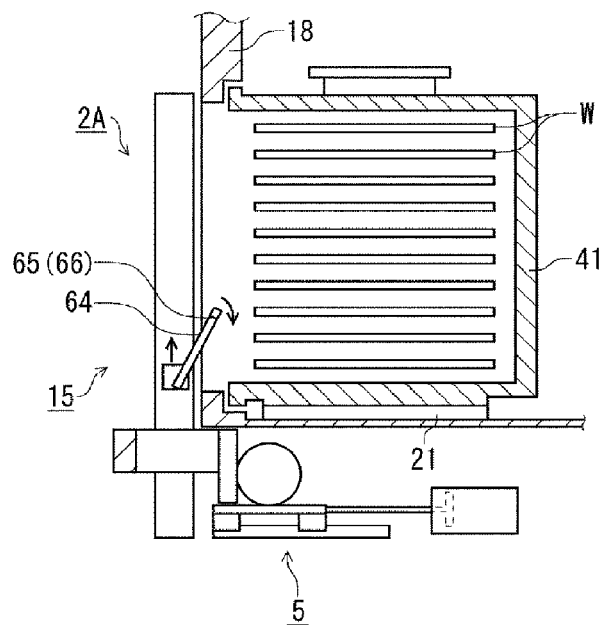
FIG. 15 is a process diagram illustrating opening of the wafer transfer opening and unloading of the wafer by the door.
Figure 16:
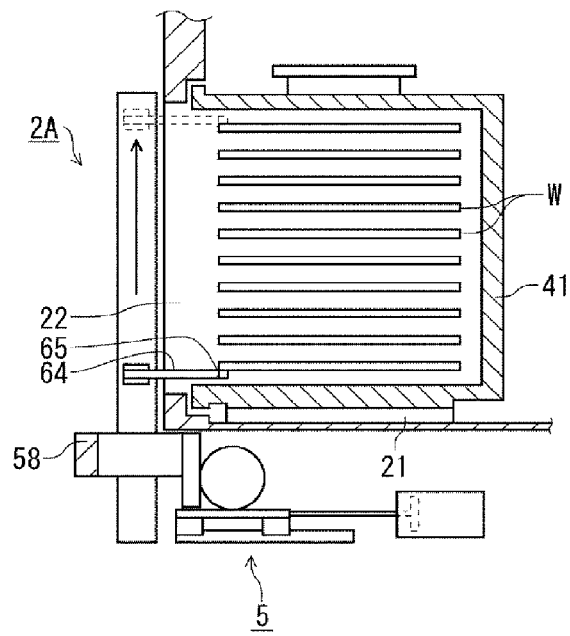
FIG. 16 is a process diagram illustrating opening of the wafer transfer opening and unloading of the wafer by the door.
Figure 17:
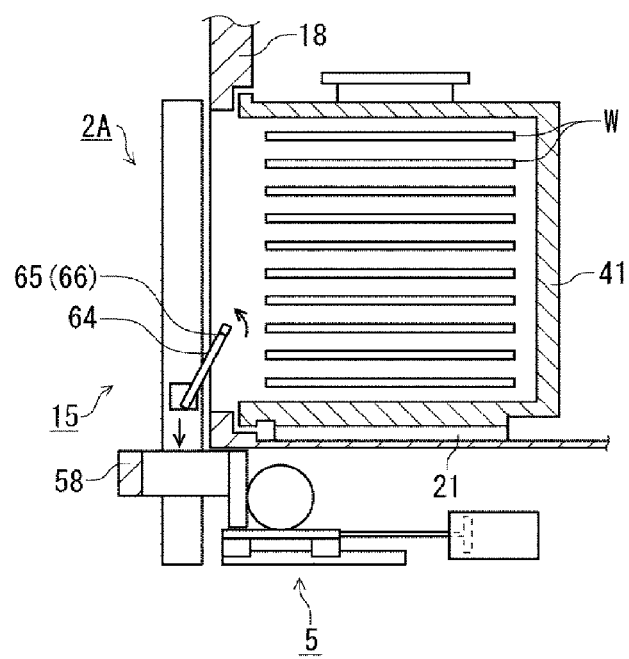
FIG. 17 is a process diagram illustrating opening of the wafer transfer opening and unloading of the wafer by the door.

Then, after the supporting arm 64 of the mapping unit 6 is moved upwards from the standby position to a certain position, the supporting arm 64 is rotated to have a horizontal posture (FIG. 15). The sensor unit 65 provided at a front end of the supporting arm 64 is introduced into the carrier C and positioned under the lowermost slot 44 within the carrier C. For simplicity of drawings, in FIGS. 12 to 18, the wafer W supported by the slot 44 is illustrated but illustration of protrusions of the slots 44 is omitted. The sensor unit 65 is moved upwards while the light emitting unit 66 of the sensor unit 65 emits light (FIG. 16), and the controller 7 checks an arrangement status of the wafer W within the carrier C. If the sensor unit 65 is positioned higher than the uppermost slot 44 and an arrangement status of all wafers W is checked, the supporting arm 64 is moved downwards and rotated to have a vertical posture. The sensor unit 65 is moved to the outside of the carrier C and returns to the standby position (FIG. 17).

Figure 18:
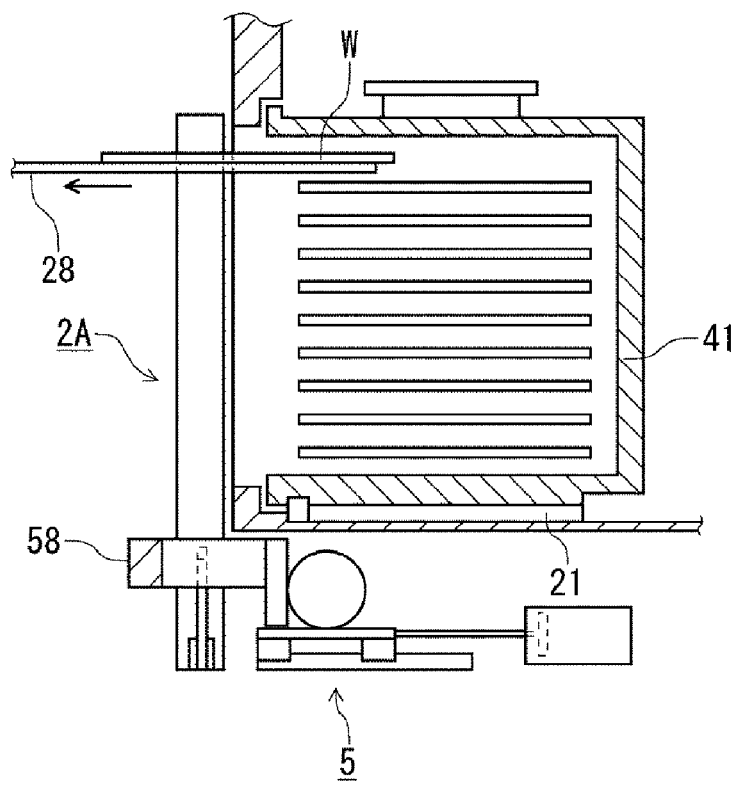
FIG. 18 is a process diagram illustrating opening of the wafer transfer opening and unloading of the wafer by the door.
Figure 19:
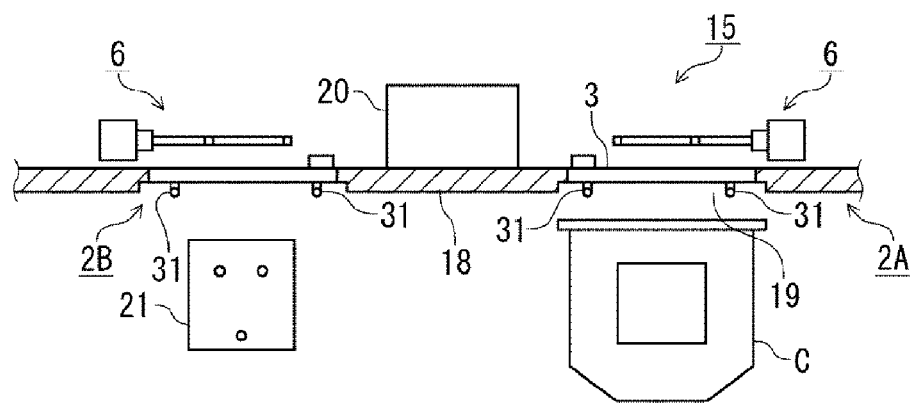
FIG. 19 is a process diagram illustrating loading of the carrier into respective loading ports arranged transversely.

Thereafter, the fork 28 of the wafer transfer unit 25A takes out wafers W in sequence from the slots 44 determined as slots in which wafers W are horizontally held as a result of checking the arrangement status and transfers the wafers W to the transfer modules TRS1 and TRS2 through the buffer module SBU (FIG. 18). Subsequently, the wafers W are transferred into the processing blocks A2 and processed as described above.

Figure 22:
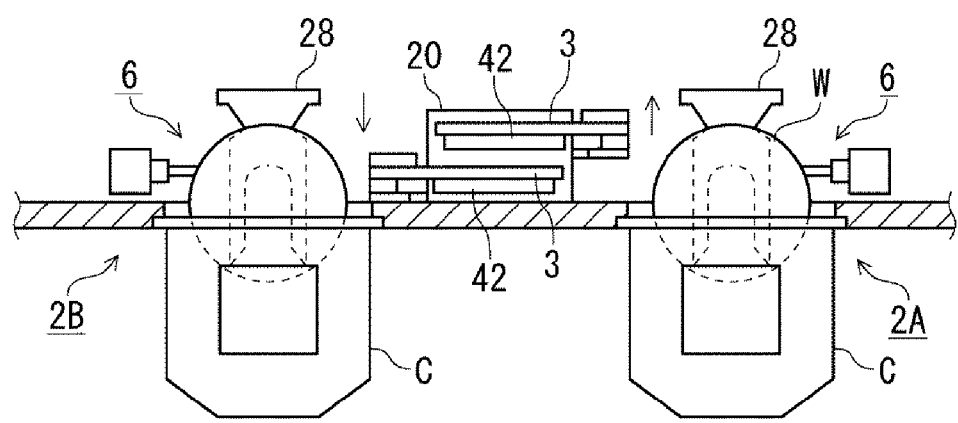
FIG. 22 is a process diagram illustrating loading of the carrier into the respective loading ports arranged transversely.

If another carrier C is mounted on the stage 21 of the loading port 2B (FIG. 21), this another carrier C is moved to the progress position in the same manner as the carrier C mounted on the stage 21 of the loading port 2A. Then, engagement between the cover body 42 and the vessel main body 41 is released. The door 3 of the loading port 2B and the cover body 42 held by the door 3 are moved backwards to be positioned in front of the door 3 of the loading port 2A, and the cover body 42 held by the door 3 and the door 3 is rotated (FIG. 22). That is, the doors 3 of the respective loading ports 2A and 2B are opened to be overlapped back and forth. The processed wafers W are introduced into the carrier C of the loading port 2B from the transfer modules TRS5 and TRS6 through the buffer module SBU by the wafer transfer unit 25B.

If all the wafers W horizontally mounted are unloaded from the loading port 2A, the door 3 of the loading port 2A closes the wafer transfer opening 22 in a manner contrary to the operation of opening the wafer transfer opening 22. Further, the cover body 42 of the carrier C and the vessel main body 41 are engaged with each other, and the engagement of the cover body 42 with the door 3 is released. Then, the stage 21 mounting thereon the carrier C is moved backwards, and the carrier C is transferred to the loading ports 2B and 2D by the carrier transfer unit 33 as described above.

In the loading port 2B, if all the wafers W are collected into the carrier C, the wafer transfer opening 22 is closed, the cover body 42 and the vessel main body 41 are engaged, the engagement of the cover body 42 with the door 3 is released, the stage 21 is moved backwards, and the carrier C is transferred to the mounting region 38 by the carrier transfer unit 33 in the same manner as the loading port 2A. In the same manner as the loading ports 2A and 2B, in the loading ports 2C and 2D, the wafer transfer opening 22 is opened and closed, and the wafer W is transferred between the carrier C and the apparatus 1.

In the carrier block A1 of the coating and developing apparatus 1, the door 3 of the wafer transfer opening 22 engages the vessel main body 41 of the carrier C with the cover body 42 and releases the engagement therebetween. Further, the door 3 is moved back and forth between the progress position where the partition wall 18 is closed and the retreat position where the cover body 42 held by the door 3 further retreats back from the partition wall 18. The door 3 moved to the retreat position is rotated around a horizontal axis to open and close the wafer transfer opening 22. With this configuration, it is possible to reduce upper and lower spaces required for opening and closing the door 3 as compared with a case where the door 3 is moved up and down with respect to the wafer transfer opening 22. As a result, a vertical size of the carrier block A1 can be reduced. Therefore, the loading ports 2 can be stacked in the same manner as the carrier block A1, and, thus, the number of the loading ports 2 transversely arranged can be reduced so that the occupation area of the carrier block A1 can be reduced.

As described above, a fixed position where the door connection member 58 forming the rotating unit 52 and the door 3 are connected is set to be eccentric from the central area of the door 3 in the transverse direction and the longitudinal direction. Therefore, it is possible to reduce a movement space of the door 3 required for opening the wafer transfer opening 22 by the rotation, and, thus, it is possible to prevent the carrier block A1 from being scaled up.

As described above, in the conventional apparatus, in order to partition off the door opening/closing driving unit 5 configured to move the door 3 up and down from the wafer transfer region 17, it is necessary to form a slit extended vertically in a partition member. However, in the present apparatus, it is not necessary to form the above-mentioned slit. Therefore, airtightness of the door opening/closing driving unit 5 is increased, and, thus, it is possible to reduce particles introduced into the wafer transfer region 17.

A time for moving up the sensor unit 65 of the mapping unit 6 from the standby position after opening the wafer transfer opening 22, a time for introducing the sensor unit 65 into the carrier C by rotation of the supporting arm 64, a time for moving up the sensor unit 65, a delay time caused by changing a moving direction of the sensor unit 65, and a time for moving down the sensor unit 65 to the standby position are about 0.8 seconds, about 0.8 seconds, about 5.1 seconds, about 0.5 seconds, and about 3.2 seconds, respectively, and about 10.4 seconds in total. Meanwhile, although it takes about 0.8 seconds to move the sensor unit 65 to the outside of the carrier C by rotation of the supporting arm 64, such a movement can be carried out concurrently with moving down the sensor unit 65 to the standby position. Accordingly, it is not necessary to additionally consider a time required for this rotation independently.

However, if the door 3 is moved downward from the wafer transfer opening 22 and the standby position of the mapping unit 6 is above the wafer transfer opening 22 as described in the conventional apparatus, a time for moving down the sensor unit 65 from the standby position, a time for introducing the sensor unit 65 into the carrier C by rotating the supporting arm 64, a time for moving up the sensor unit 65, a delay time caused by changing a moving direction of the sensor unit 65, a time for moving down the sensor unit 65 in order not to collide the sensor unit 65 with the partition wall 18 by rotating the supporting arm 64, a time for moving the sensor unit 65 to the outside of the carrier C by rotating the supporting arm 64, and a time for moving upward the sensor unit 65 to the standby position are about 3.2 seconds, about 0.8 seconds, about 5.1 seconds, about 0.5 seconds, about 0.7 seconds, about 0.8 seconds, and about 1.3 seconds, respectively, and about 12.4 seconds in total.

That is, in the present illustrative embodiment, since the door 3 is configured to be rotatable and the standby position of the mapping unit 6 is lower than the wafer transfer opening 22, it is not necessary to move down the sensor unit 65 in order not to collide the sensor unit 65 with the partition wall 18. Further, the sensor unit 65 is moved to the standby position concurrently with unloading the sensor unit 65 from the carrier C. Therefore, it is possible to quickly check an arrangement status to unload the wafer W. Accordingly, the configuration in the present illustrative embodiment has an advantage over a configuration in which the door 3 is moved downward and the standby position of the mapping unit 6 is set to be higher than the wafer transfer opening 22.

Figure 23:
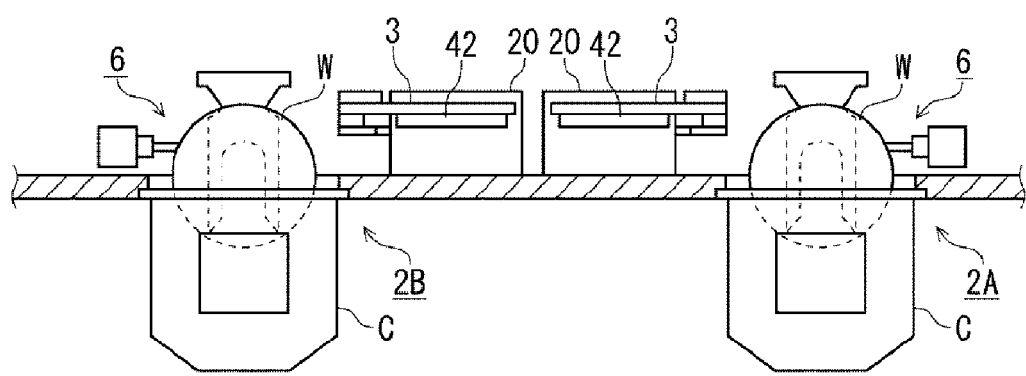
FIG. 23 is a transversal plane view of another loading port.

The doors 3 of the loading ports horizontally arranged are overlapped with each other when the doors 3 are opened since rotation positions thereof are deviated from each other in a forward and backward direction. Therefore, it is possible to reduce a horizontal size of the carrier block A1. However, as depicted in FIG. 23, the both loading ports 2 may be separated away from each other in order that the doors 3 are not overlapped with each other when the respective doors are opened. In this case, it is possible to reduce a forward/backward size of the carrier block A1.

In the above-described illustrative embodiment, the door connection member 58 may be connected to the slider 54 instead of the link member 57. Then, the slider 54, the cylinder 55, and the guide rail 53 may be connected to a rotation device formed of a motor or the like to be rotated. That is, in the above-described illustrative embodiment, the rotating unit 52 is provided at the reciprocating unit 51, and the rotating unit 52 is moved back and forth. However, the reciprocating unit 51 may be provided at a rotating unit 52 and the reciprocating unit 51 may be rotated together with the door 3.

Figure 24:
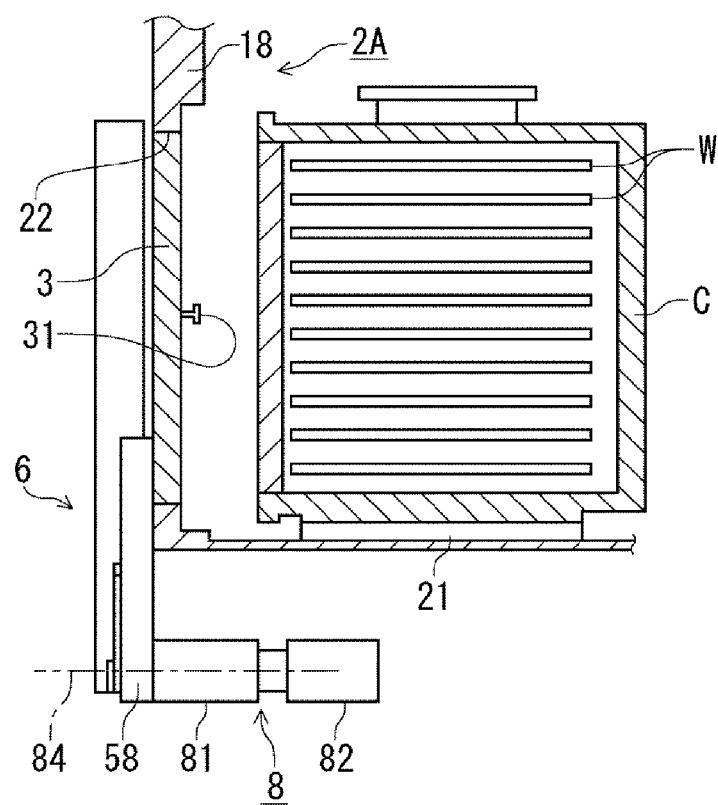
FIG. 24 is a side view illustrating a configuration of another door.
Figure 25:
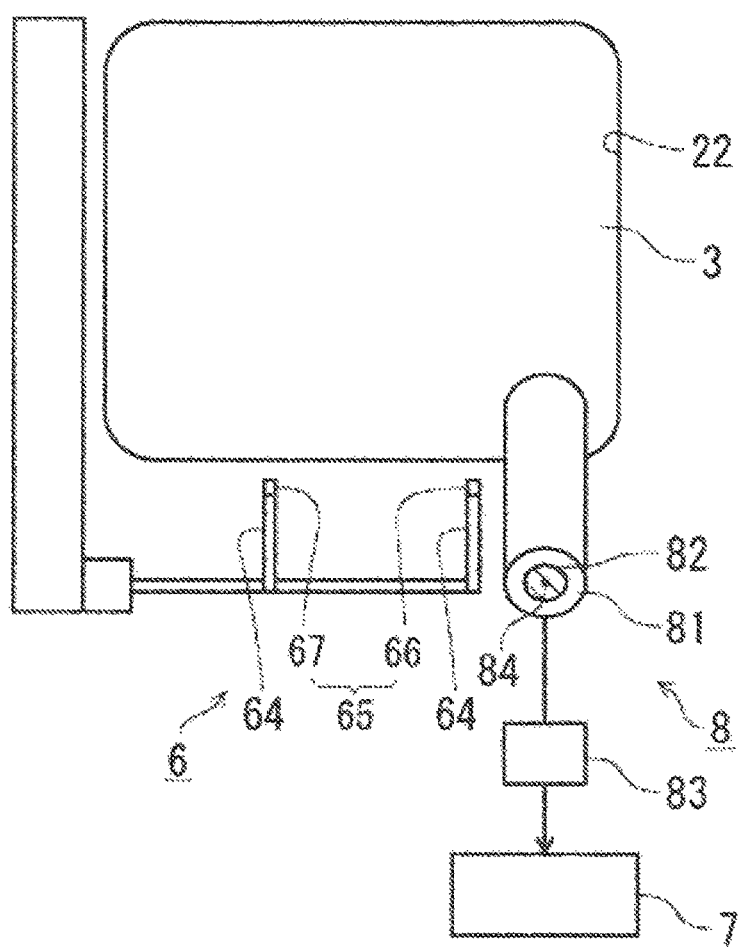
FIG. 25 is a rear view of the door.

FIGS. 24 and 25 are a side view and a rear view of another door 3. The door opening/closing driving unit 8 of the door 3 is formed of, for example, a motor and includes a rotating unit 81 and a reciprocating unit 82. The rotating unit 81 is connected to the door connection member 58 of the door 3 and a reciprocating unit 82 is connected to the rotating unit 81 and configured to move the rotating unit 81 and the door 3 back and forth. The motor is connected to an encoder 83. A pulse number of pulse signals outputted from the encoder 83 to the controller 7 varies depending on rotation degrees of the motor. By measuring the pulse number, the controller 7 can measure inclination of the door 3. Further, a reference numeral 84 in FIGS. 24 and 25 denotes a rotation axis of the door 3 rotated by the rotating unit 81.

Figure 26:
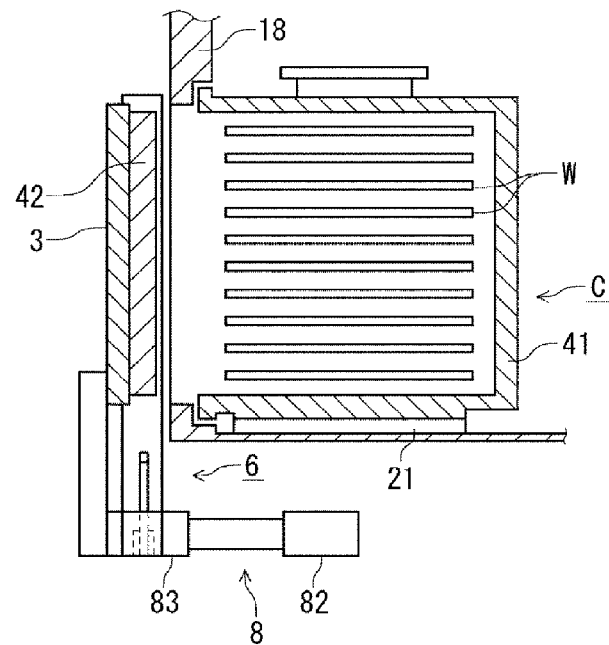
FIG. 26 is a process diagram illustrating a status where the door is being opened.
Figure 27:
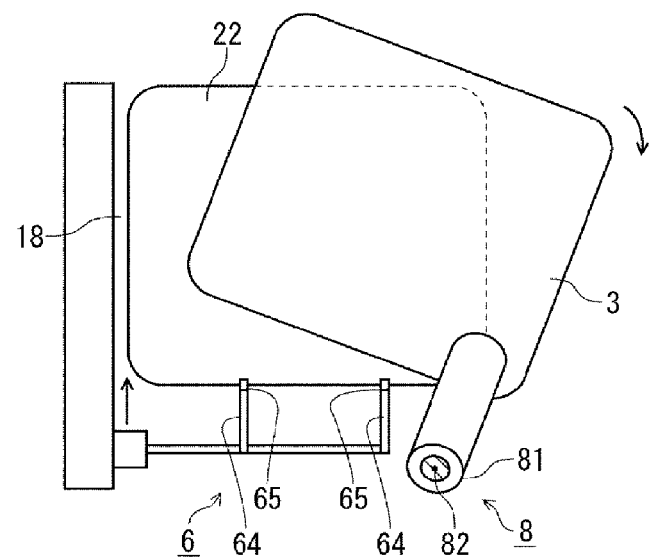
FIG. 27 is a process diagram illustrating the status where the door is being opened and an operation of a mapping unit.
Figure 28:
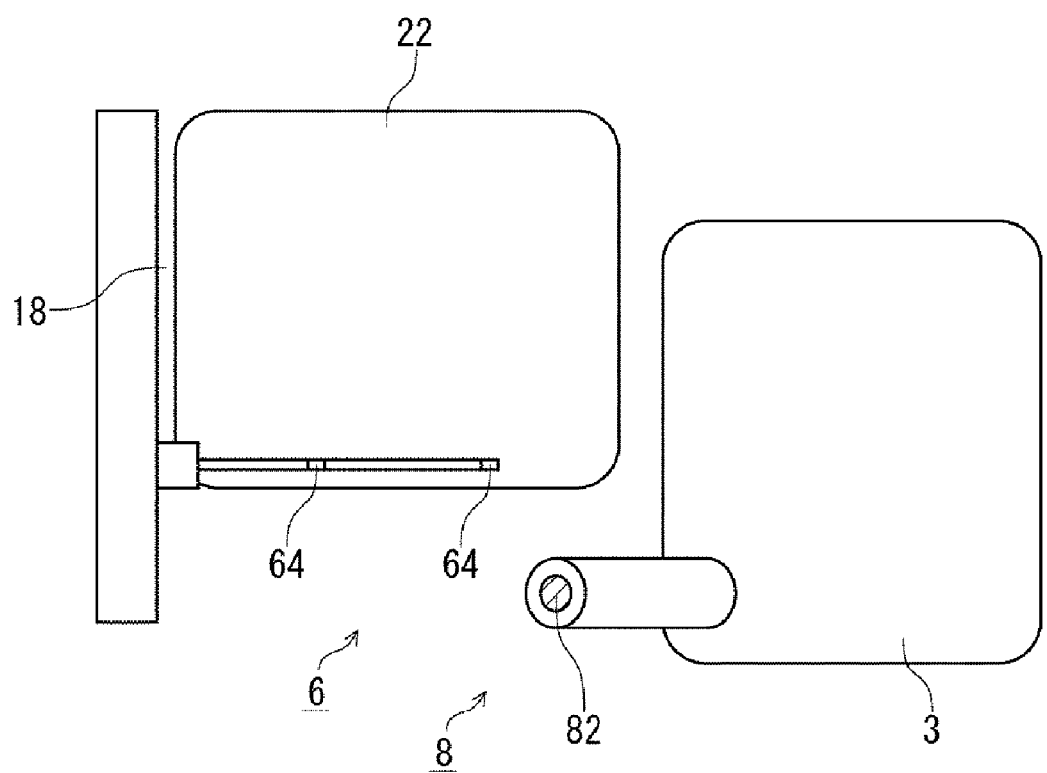
FIG. 28 is a process diagram illustrating the status where the door is being opened and the operation of the mapping unit.

There will be explained a process of opening the wafer transfer opening 22 by the door 3. In the same manner as the above-described illustrative embodiment, the door 3 holds the cover body 42 of the carrier C and retreats in order for the cover body 42 not to interfere with the partition wall 18 when being rotated as depicted in FIG. 26. If the door 3 is rotated by the rotating unit 81, the controller 7 transmits a control signal to the mapping unit 6 based on a pulse signal outputted from the encoder 83 and moves the sensor unit 65 upwards in order for the sensor unit 65 not to interfere with the cover body 42 and the door 3, as depicted in FIG. 27. That is, the wafer transfer opening 22 is opened by rotation of the door 3 at the same time when the sensor unit 65 is moved upwards. If the sensor unit 65 is moved upwards to a certain position, the supporting arm 64 is rotated in the same manner as the above-described illustrative embodiment and the sensor unit 65 is introduced into the carrier C, and then, an arrangement status of wafers W is checked (FIG. 28).

Since the opening operation and the upward moving operation of the sensor unit 65 are carried out concurrently, it is possible to reduce a time until the wafers W are loaded into the coating and developing apparatus 1 after opening the wafer transfer opening 22. As a result, throughput can be increased. In the above-described door opening/closing driving unit 5, in order to rotate the door 3, elapse time data after a control signal is transmitted to the cylinder 56 and position data of the door 3 at each time are previously acquired. Then, based on the acquired data, a time until the sensor unit 65 is started to move up after the control signal is transmitted is set. Thus, the rotation of the door 3 and the upward movement of the sensor unit 65 may be carried out concurrently.

Figure 29:
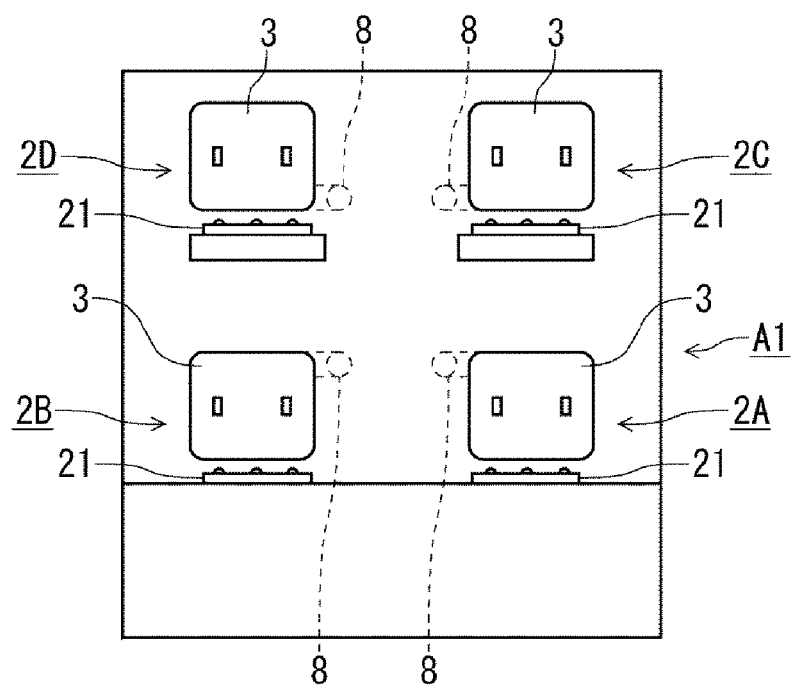
FIG. 29 is a schematic front view illustrating a configuration of another carrier block.
Figure 30:
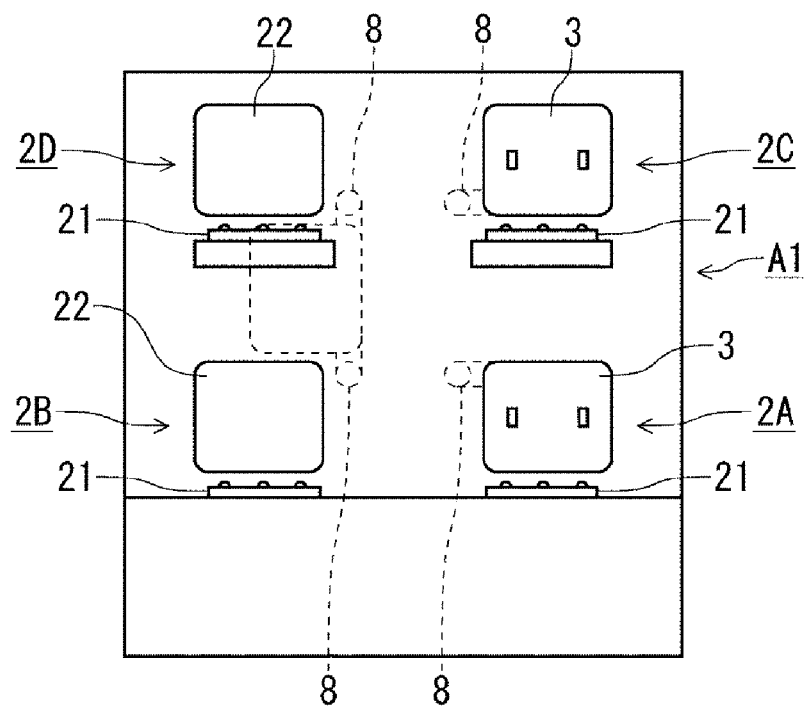
FIG. 30 is a schematic front view of the carrier block.
Figure 31:
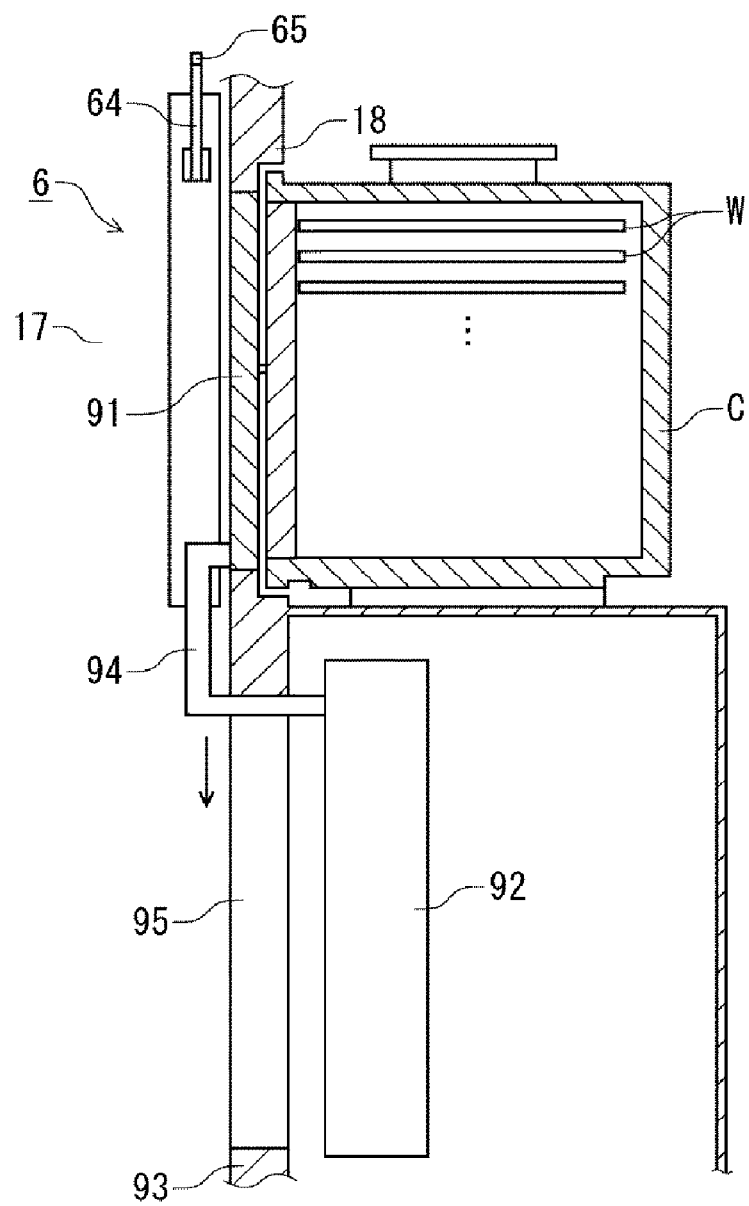
FIG. 31 is a longitudinal side view illustrating a configuration of a conventional loading port.
Figure 32:
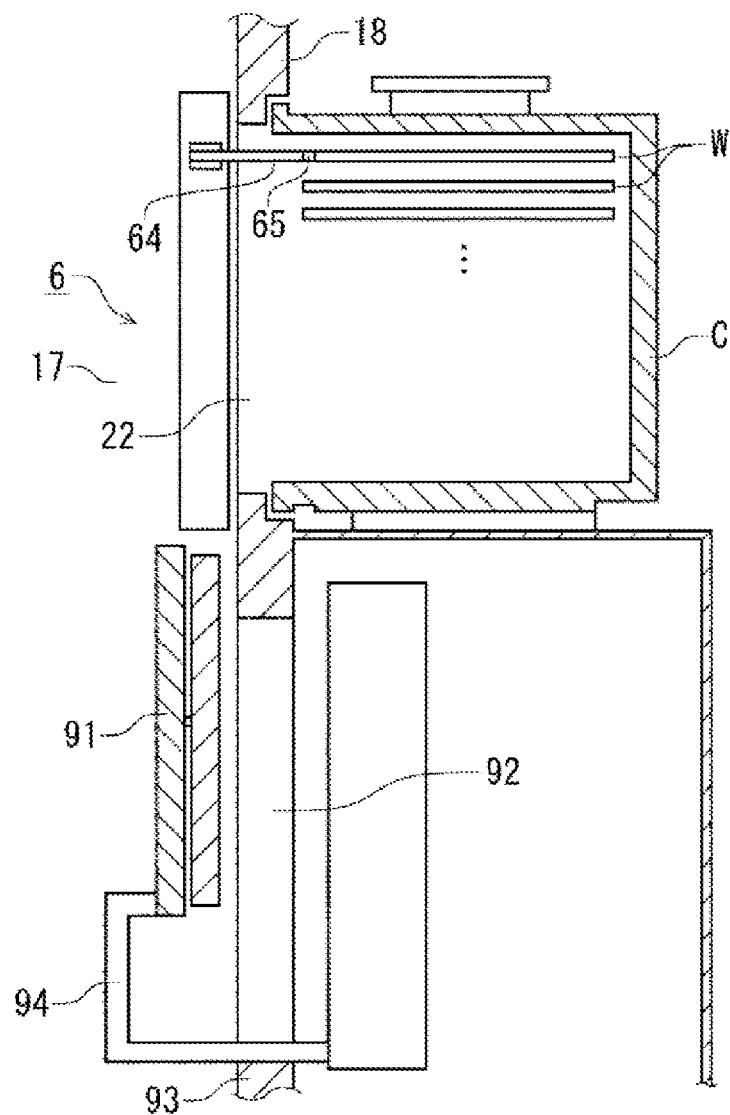
FIG. 32 is a longitudinal side view illustrating the conventional loading port.

In the above-described illustrative embodiments, although the respective doors 3 of the loading ports transversely arranged are overlapped with each other when the doors 3 are opened, the respective doors 3 of the loading ports vertically arranged may be overlapped with each other when the doors 3 are opened. FIGS. 29 and 30 schematically illustrate a front surface side of the carrier block A1. FIG. 29 illustrates a status where the doors 3 of the respective loading ports 2A to 2D are closed, and FIG. 30 illustrates a status where the doors 3 of the loading ports 2B and 2D are opened while the doors 3 of the loading ports 2A and 2C are closed. In the same manner as a case where the doors 3 transversely arranged are overlapped with each other, the doors 3 of the respective loading ports 2B and 2D hold the cover bodies 42 of the carriers C, and then, retreat to positions where the doors 3 are not interfered with each other. When the doors 3 are rotated, the doors 3 are overlapped with each other. Likewise, the doors 3 of the loading ports 2A and 2C are overlapped with each other when the doors 3 are opened. With this configuration, a height of the carrier block A1 can be further reduced and miniaturization can be advanced.

In the above-described illustrative embodiments, the loading ports 2 are stacked at two levels and may be stacked at three or more levels. Further, the illustrative embodiments may be applied to an apparatus configured to load and unload substrates other than the wafer W, for example, a FPD (Flat Panel Display) substrate, a mask/reticle substrate for a or the like. A user may selectively set the respective loading ports 2A to 2D as loading ports configured to load a wafer into the apparatus from the carrier C or as loading ports configured to unload a wafer from the apparatus to the carrier C. That is, the loading ports 2A and 2C are not limited to the loading ports configured to load a wafer and the loading ports 2B and 2D are not limited to the loading ports configured to unload a wafer. The loading port that loads the wafer W into the apparatus may return the wafer W to the carrier C.

What is claimed is:

1. A substrate transfer device that transfers a substrate by allowing a substrate opening formed on a front surface of a substrate transfer vessel to face an opening formed on a partition wall from one side of the partition wall and separating a cover body of the substrate transfer vessel from the other side of the partition wall, the substrate transfer device comprising:
    a door configured to open and close the opening from the other side of the partition wall;
    an attaching/detaching unit provided at the door and configured to detachably attach the cover body to the substrate transfer vessel;
    a reciprocating unit configured to straightly move the door back and forth between a first position where the opening is closed and a second position away from the first position toward the other side of the partition wall; and
    a rotating unit configured to rotate the door between the second position and a third position deviated from a region facing the opening,
    wherein the door is rotated about a rotation axis, the rotation axis being parallel to a direction in which the door straightly moves between the first position and the second position.

2. The substrate transfer device of claim 1,
wherein the rotating unit comprises a rotating member of which one end side is fixed at the rotation axis and the other end side is fixed at a position eccentric from a center of the door in a horizontal direction and a vertical direction.

3. The substrate transfer device of claim 1,
wherein multiple sets containing the opening, the door, the reciprocating unit, and the rotating unit are vertically arranged.

4. The substrate transfer device of claim 1,
wherein multiple sets containing the opening, the door, the reciprocating unit, and the rotating unit are horizontally arranged.

5. The substrate transfer device of claim 1,
wherein the third position is set to be away from the second position in a horizontal direction.

6. The substrate transfer device of claim 1,
wherein the third position is set to be away from the second position in a vertical direction.

7. The substrate transfer device of claim 1,
wherein the third position of one set of adjacent two sets containing the opening, the door, the reciprocating unit, and the rotating unit and the third position of the other set are overlapped back and forth with each other.

8. The substrate transfer device of claim 1, further comprising:
    a substrate detection unit having a sensor unit configured to detect the substrate positioned in a horizontal posture and an elevation unit configured to move the sensor unit up and down at the other side of the partition wall; and
    a controller configured to control the substrate detection unit and the rotating unit by outputting a control signal to the substrate detection unit and the rotating unit,
    wherein the controller is configured to output a control signal such that an upward movement or a downward movement of the sensor unit and an opening operation of the opening by rotating the door are concurrently performed.

9. A substrate transfer method comprising:
    allowing a substrate opening formed on a front surface of a substrate transfer vessel to face an opening formed on a partition wall from one side of the partition wall;
    separating a cover body of the substrate transfer vessel from the other side of the partition wall by detachably attaching the cover body to the substrate transfer vessel through an attaching/detaching unit provided at a door configured to open and close the opening;

opening and closing the opening from the other side of the partition wall by straightly moving the door back and forth between a first position where the opening is closed and a second position away from the first position toward the other side of the partition wall through a reciprocating unit and by rotating the door between the second position and a third position deviated from a region facing the opening through a rotating unit; and transferring a substrate between the other side of the partition wall and the substrate transfer vessel through the opened opening, wherein the door is rotated about a rotation axis, the rotation axis being parallel to a direction in which the door straightly moves between the first position and the second position.

10. The substrate transfer method of claim 9, further comprising:

moving up and down a sensor unit provided at the other side of the partition wall and configured to detect the substrate positioned in a horizontal posture through an elevation unit, wherein the opening of the opening by the rotation of the door and the moving up and down of the sensor unit are concurrently performed.

11. A computer-readable storage medium having stored thereon computer-executable instructions that, in response to execution, cause a substrate transfer device to perform a substrate transfer method as claimed in claim 9, wherein the substrate transfer device is configured to transfer a substrate by allowing a substrate opening formed on a front surface of a substrate transfer vessel to face an opening formed on a partition wall from one side of the partition wall and separating a cover body of the substrate transfer vessel from the other side of the partition.

* * * * *